United States Patent
Bhattacharjee et al.

(10) Patent No.: US 9,391,588 B2
(45) Date of Patent: Jul. 12, 2016

(54) MEMS VIBRATING STRUCTURE USING AN ORIENTATION DEPENDENT SINGLE-CRYSTAL PIEZOELECTRIC THIN FILM LAYER

(71) Applicant: RF Micro Devices, Inc., Greensboro, NC (US)

(72) Inventors: Kushal Bhattacharjee, Kernersville, NC (US); Sergei Zhgoon, Moscow (RU)

(73) Assignee: RF Micro Devices, Inc., Greensboro, NC (US)

(*) Notice: Subject to any disclaimer, the term of this patent is extended or adjusted under 35 U.S.C. 154(b) by 471 days.

(21) Appl. No.: 14/031,383

(22) Filed: Sep. 19, 2013

(65) Prior Publication Data

US 2014/0210314 A1    Jul. 31, 2014

Related U.S. Application Data

(63) Continuation-in-part of application No. 12/202,624, filed on Sep. 2, 2008.

(60) Provisional application No. 61/703,852, filed on Sep. 21, 2012, provisional application No. 60/969,314, filed on Aug. 31, 2007.

(51) Int. Cl.
*H01L 41/053* (2006.01)
*H01L 41/047* (2006.01)
(Continued)

(52) U.S. Cl.
CPC ........... *H03H 9/17* (2013.01); *H03H 2009/155* (2013.01)

(58) Field of Classification Search
USPC ......... 310/320, 321, 348, 349, 351, 353, 365; 252/62.9 PZ; 501/134, 136; 333/186, 333/189
See application file for complete search history.

(56) References Cited

U.S. PATENT DOCUMENTS

| 4,798,989 A | 1/1989 | Miyazaki et al. |
| 5,739,624 A | 4/1998 | Kleiman |

(Continued)

FOREIGN PATENT DOCUMENTS

| JP | 57078206 A | 5/1982 |
| JP | 58095690 A | 6/1983 |
| WO | 03042687 A1 | 5/2003 |

OTHER PUBLICATIONS

Non-Final Office Action for U.S. Appl. No. 12/202,624, mailed Apr. 9, 2015, 7 pages.

(Continued)

*Primary Examiner* — Thomas Dougherty
(74) *Attorney, Agent, or Firm* — Withrow & Terranova, P.L.L.C.

(57) ABSTRACT

A micro-electrical-mechanical system (MEMS) vibrating structure includes a carrier substrate, a first anchor, a second anchor, a single crystal piezoelectric body, and a conducting layer. The first anchor and the second anchor are provided on the surface of the carrier substrate. The single-crystal piezoelectric body is suspended between the first anchor and the second anchor, and includes a uniform crystalline orientation defined by a set of Euler angles. The single-crystal piezoelectric body includes a first surface parallel to and facing the surface of the carrier substrate on which the first anchor and the second anchor are formed and a second surface opposite the first surface. The conducting layer is inter-digitally dispersed, and is formed on the second surface of the single-crystal piezoelectric body. The first surface of the single-crystal piezoelectric body is left exposed.

32 Claims, 21 Drawing Sheets

(51) Int. Cl.

| | |
|---|---|
| H03H 9/25 | (2006.01) |
| H03H 9/125 | (2006.01) |
| H03H 9/15 | (2006.01) |
| C04B 35/00 | (2006.01) |
| H03H 9/17 | (2006.01) |

(56) References Cited

U.S. PATENT DOCUMENTS

| | | | |
|---|---|---|---|
| 6,249,073 B1* | 6/2001 | Nguyen et al. | 310/309 |
| 6,336,366 B1 | 1/2002 | Thundat et al. | |
| 6,349,454 B1 | 2/2002 | Manfra et al. | |
| 6,437,486 B1 | 8/2002 | Burcsu et al. | |
| 6,767,749 B2 | 7/2004 | Kub et al. | |
| 6,909,221 B2 | 6/2005 | Ayazi et al. | |
| 7,250,705 B2 | 7/2007 | Dewa et al. | |
| 7,315,107 B2 | 1/2008 | Kando et al. | |
| 7,492,241 B2 | 2/2009 | Piazza et al. | |
| 7,586,239 B1 | 9/2009 | Li et al. | |
| 7,626,846 B2 | 12/2009 | Rao et al. | |
| 7,639,105 B2 | 12/2009 | Ayazi et al. | |
| 7,750,759 B1 | 7/2010 | Lee et al. | |
| 7,898,158 B1 | 3/2011 | Li et al. | |
| 8,035,280 B2 | 10/2011 | Li et al. | |
| 8,508,108 B2* | 8/2013 | Anand et al. | 310/339 |
| 9,117,593 B2 | 8/2015 | Bhattacharjee | |
| 2003/0006676 A1 | 1/2003 | Smith et al. | |
| 2003/0119220 A1 | 6/2003 | Mlcak et al. | |
| 2004/0125472 A1 | 7/2004 | Belt | |
| 2005/0035687 A1 | 2/2005 | Xu et al. | |
| 2005/0184627 A1 | 8/2005 | Sano et al. | |
| 2006/0082256 A1 | 4/2006 | Bibl et al. | |
| 2006/0131997 A1 | 6/2006 | Kim et al. | |
| 2007/0200458 A1 | 8/2007 | Yoshino et al. | |
| 2007/0209176 A1 | 9/2007 | Kawakubo et al. | |
| 2007/0228887 A1 | 10/2007 | Nishigaki et al. | |
| 2007/0284971 A1 | 12/2007 | Sano et al. | |
| 2010/0194499 A1 | 8/2010 | Wang et al. | |
| 2010/0237709 A1 | 9/2010 | Hall et al. | |
| 2011/0181150 A1 | 7/2011 | Mahameed et al. | |
| 2014/0125201 A1 | 5/2014 | Bhattacharjee | |
| 2014/0125431 A1* | 5/2014 | Bhattacharjee | 333/186 |
| 2014/0183669 A1* | 7/2014 | Xu et al. | 257/415 |
| 2014/0210315 A1 | 7/2014 | Bhattacharjee et al. | |

OTHER PUBLICATIONS

Author Unknown, "Soitec Innovative Process for Materials Treatments—SMART CUT(R)," Soitec, Retrieved: Apr. 20, 2010, 1 page, www.soitec.com.
Bassignot, F. et al., "A new acoustic resonator concept based on acoustic waveguides using silicon/periodically poled transducer/silicon structures for RF applications," 2011 Joint Conference of the IEEE International Frequency Control and the European Frequency and Time Forum (FCS), 6 pages.
Batchko, Robert G. et al., "Backswitch Poling in Lithium Niobate for High-Fidelity Domain Patterning and Efficient Blue Light Generation," Applied Physics Letters, vol. 75, No. 12, Sep. 20, 1999, pp. 1673-1675.
Brown, Paul T. et al., "Control of Domain Structures in Lithium Tantalate Using Interferometric Optical Patterning," Optics Communications, vol. 163, May 15, 1999, pp. 310-316.
Chandrahalim, Hengky et al., "Channel-Select Micromechanical Filters Using High-K Dielectrically Transduced MEMS Resonators," Proceedings of the 19th International IEEE Micro Electro Mechanical Systems Conference (MEMS 2006), Jan. 22-26, 2006, pp. 894-897, Istanbul, Turkey.
Chen, Yan-Feng et al., "High-Frequency Resonance in Acoustic Superlattice of Periodically Poled LiTaO3," Applied Physics Letters, vol. 70, No. 5, Feb. 3, 1997, pp. 592-594.
Courjon, E. et al., "Periodically Poled Transducers Built on Single Crystal Lithium Niobate Layers Bonded onto Silicon," IEEE Ultrasonics Symposium, 2007, pp. 268-271.
Courjon, E. et al., "Pure Longitudinal Plate Mode Excited by Poled Domains Transducers on LiNbO3," Proceedings, EFTP*IEEE-FCS'07, May 29-Jun. 1, 2007, pp. 1073-1076.
Feld, David et al., "A High Performance 3.0 mm×3.0 mm×1.1 mm FBAR Full Band Tx Filter for U.S. PCS Handsets," Proceedings of the 2002 IEEE Ultrasonics Symposium, pp. 913-918.
Kondo, Jungo et al., "High-Speed and Low-Driving-Voltage Thin-Sheet X-Cut LiNbO3 Modulator with Laminated Low-Dielectric-Constant Adhesive," IEEE Photonics Technology Letters, vol. 17, No. 10, Oct. 2005, pp. 2077-2079.
Kumar, A. K. Sarin et al., "High-Frequency Surface Acoustic Wave Device Based on Thin-Film Piezoelectric Interdigital Transducers," Applied Physics Letters, vol. 85, No. 10, Sep. 6, 2004, pp. 1757-1759.
Li, Sheng-Shian et al., "Self-Switching Vibrating Micromechanical Filter Bank," Proceedings of the Joint IEEE Int. Frequency Control/Precision Time & Time Interval Symposium, Aug. 29-31, 2005, pp. 135-141, Vancouver, Canada.
Liu, Xiaoyan et al., "Nanoscale Chemical Etching of Near-Stoichiometric Lithium Tantalate," Journal of Applied Physics, vol. 97, 2005, pp. 064308-1 to 064308-4.
Majjad, H. et al., "Low Temperature Bonding of Interface Acoustic Waves Resonators on Silicon Wafers," Proceedings of the 2005 IEEE Ultrasonics Symposium, 2005, pp. 1307-1310.
Myers, L. E. et al., "Quasi-Phase-Matched Optical Parametric Oscillators in Bulk Periodically Poled LiNbO3," J. Opt. Soc. Am. B, vol. 12, No. 11, Nov. 1995, pp. 2102-2116.
Nakamura, Kiyoshi et al., "Local Domain Inversion in Ferroelectric Crystals and its Application to Piezoelectric Devices," 1989 Ultrasonics Symposium, Copyright: 1989, pp. 309-318.
Ostrovskii, I. V. et al., "Free Vibration of Periodically Poled Ferroelectric Plate," Journal of Applied Physics, vol. 99, No. 114106, 2006, pp. 114106-1 to 114106-6.
Pastureaud, Thomas et al., "High-Frequency Surface Acoustic Waves Excited on Thin-Oriented LiNbO3 Single-Crystal Layers Transferred Onto Silicon," IEEE Transactions on Ultrasonics, Ferroelectrics, and Frequency Control, vol. 54, No. 4, Apr. 2007, pp. 870-876.
Wang, Jing et al., "1.14-GHz Self-Aligned Vibrating Micromechanical Disk Resonator," Technical Digest of the 2003 Radio Frequency Integrated Circuits Symposium, Jun. 8-10, 2003, pp. 335-338, Philadelphia, Pennsylvania.
Wong, Ark-Chew et al., "Micromechanical Mixer-Filters ('Mixlers')," Journal of Microelectromechanical Systems, vol. 13, No. 1, Feb. 2004, pp. 100-112.
Yamada, M. et al., "First-Order Quasi-Phase Matched LiNbO3 Waveguide Periodically Poled by Applying an External Field for Efficient Blue Second-Harmonic Generation," Applied Physics Letters, vol. 62, No. 5 Feb. 1, 1993, pp. 435-436.
Zhu, Yong-Yuan et al., "Crossed Field Excitation of an Acoustic Superlattice," Journal of Physics D: Applied Physics, vol. 29, 1996, pp. 185-187.
Zhu, Yong-Yuan et al., "Ultrasonic Excitation and Propagation in an Acoustic Superlattice," Journal of Applied Physics, vol. 72, No. 3, Aug. 1, 1992, pp. 904-914.
Notice of Allowance for U.S. Appl. No. 12/134,483, mailed Mar. 24, 2009, 6 pages.
Notice of Allowance for U.S. Appl. No. 12/263,883, mailed Oct. 28, 2010, 6 pages.
Notice of Allowance for U.S. Appl. No. 13/037,584, mailed Jun. 9, 2011, 7 pages.
Notice of Allowance for U.S. Appl. No. 14/071,173, mailed Apr. 21, 2015, 8 pages.
Aigner, R. et al., "Advancement of MEMS into RF-Filter Applications," IEDM: International Electron Devices Meeting, Dec. 8-11, 2002, pp. 897-900, San Francisco CA.
Aigner, Robert et al., "Bulk-Acoustic-Wave Filters: Performance Optimization and Volume Manufacturing," IEEE MTT-S Digest, 2003, pp. 2001-2004.
Bannon, III, Frank D. et al., "High-Q HF Microelectromechanical Filters," IEEE Journal of Solid-State Circuits, vol. 35, No. 4, Apr. 2000, pp. 512-526.

(56) References Cited

OTHER PUBLICATIONS

Hannon, John J. et al., "Lithium Tantalate and Lithium Niobate Piezoelectric Resonators in the Medium Frequency Range With Low Ratios of Capacitance and Low Temperature Coefficients of Frequency," IEEE Transactions on Sonics and Ultrasonics, vol. SU-17, No. 4, Oct. 1970, pp. 239-246.
Ho, Gavin K. et al., "High-Order Composite Bulk Acoustic Resonators," IEEE 20th International Conference on Micro Electro Mechanical Systems, 2007, pp. 791-794.
Hsu, Wan-Thai et al., "Stiffness Compensated Temperature-Insensitive Micromechanical Resonators," Technical Digest of the International Micro Electro Mechanical Systems Conference, 2002, pp. 731-734.
Author Unknown, "An American National Standard: IEEE Standard on Piezoelectricity," ANSI/IEEE Std 176-1987, Copyright: 1988, 74 pages, The Institute of Electrical and Electronics Engineers, Inc., New York, NY.
Iula, Antonio et al., "A Model for the Theoretical Characterization of Thin Piezoceramic Rings," IEEE Transactions on Ultrasonics, Ferroelectrics, and Frequency Control, vol. 43, No. 3, May 1996, pp. 370-375.
Kadota, Michio et al., "High Frequency Lamb Wave Resonator using LiNbO3 Crystal Thin Plate and Application to Tunable Filter," 2010 IEEE International Ultrasonics Symposium Proceedings, 2010, pp. 962-965.
Kim, Bongsang et al., "Frequency Stability of Wafer-Scale Encapsulated MEMS Resonators," The 13th International Conference on Solid-State Sensors, Actuators and Microsystems, Jun. 5-9, 2005, pp. 1965-1968.
Kovacs, G. et al., "Improved Material Constants for LiNbO3 and LiTaO3," 1990 Ultrasonics Symposium, Copyright: 1990, pp. 435-438.
Li, Sheng-Shian et al., "Micromechanical 'Hollow-Disk' Ring Resonators," Proceedings of the 17th International IEEE Micro Electro Mechanical Systems Conference, Jan. 25-29, 2004, pp. 821-824.
Onoe, Morio et al., "Zero Temperature Coefficient of Resonant Frequency in an X-Cut Lithium Tantalate at Room Temperature," Proceedings of the IEEE: Proceedings Letters, Aug. 1969, pp. 1446-1448.
Osugi, Yukihisa et al., "Single Crystal FBAR with LiNbO3 and LiTaO3 Piezoelectric Substance Layers," IEEE/MTT-S International Microwave Symposium, Jun. 3-8, 2007, pp. 873-876.
Piazza, G. et al., "Low Motional Resistance Ring-Shaped Contour-Mode Aluminum Nitride Piezoelectric Micromechanical Resonators for UHF Applications," 18th IEEE International Conference on Micro Electro Mechanical Systems, Jan. 30-Feb. 3, 2005, pp. 20-23.
Ruby, R. et al., "PCS 1900 MHz Duplexer Using Thin Film Bulk Acoustic Resonators (FBARs)," Electronics Letters, vol. 35, No. 10, May 13, 1999, pp. 794-795.
Ruby, Richard C. et al., "Thin Film Bulk Wave Acoustic Resonators (FBAR) for Wireless Applications," 2001 IEEE Ultrasonics Symposium, 2001, pp. 813-821.
Ruby, Richard et al., "Ultra-Miniature High-Q Filters and Duplexers Using FBAR Technology," 2001 IEEE International Solid-State Circuits Conference, Feb. 6, 2001, 3 pages.
Sliker, T. R. et al., "Frequency-Temperature Behavior of X-Cut Lithium Tantalate Resonators," Proceedings of the IEEE, Aug. 1968, p. 1402.
Smith, R. T. et al., "Temperature Dependence of the Elastic, Piezoelectric, and Dielectric Constants of Lithium Tantalate and Lithium Niobate," Journal of Applied Physics, vol. 42, No. 6, May 1971, pp. 2219-2230.
Author Unknown, "Standards on Piezoelectric Crystals, 1949," Proceedings of the I.R.E., Dec. 1949, pp. 1378-1395.
Stephanou, P. J. et al., "GHz Contour Extensional Mode Aluminum Nitride MEMS Resonators," 2006 IEEE Ultrasonics Symposium, 2006, pp. 2401-2404.
Stephanou, P. J. et al., "GHz Higher Order Contour Mode ALN Annular Resonators," IEEE 20th International Conference on Micro Electro Mechanical Systems, Jan. 21-25, 2007, pp. 787-790.
Wang, Jing et al., "1.156-GHz Self-Aligned Vibrating Micromechanical Disk Resonator," IEEE Transactions on Ultrasonics, Ferroelectrics, and Frequency Control, vol. 51, No. 12, Dec. 2004, pp. 1607-1628.
Warner, A. W. et al., "Low Temperature Coefficient of Frequency in a Lithium Tantalate Resonator," Proceedings of the IEEE, Mar. 1967, p. 450.
Weisstein, Eric W., "Euler Angles," MathWorld—A Wolfram Web Resource, Retrieved: Apr. 29, 2009, http://mathworld.wolfram.com/EulerAngles.html, 4 pages.
Non-Final Office Action for U.S. Appl. No. 12/202,624, mailed May 18, 2012, 8 pages.
Final Office Action for U.S. Appl. No. 12/202,624, mailed Jul. 27, 2012, 8 pages.
Advisory Action for U.S. Appl. No. 12/202,624, mailed Sep. 7, 2012, 3 pages.
Non-Final Office Action for U.S. Appl. No. 12/202,624, mailed Mar. 5, 2014, 8 pages.
Quayle Action for U.S. Appl. No. 14/071,025, mailed Mar. 8, 2016, 6 pages.
Notice of Allowance for U.S. Appl. No. 14/031,454, mailed Mar. 4, 2016, 8 pages.

* cited by examiner

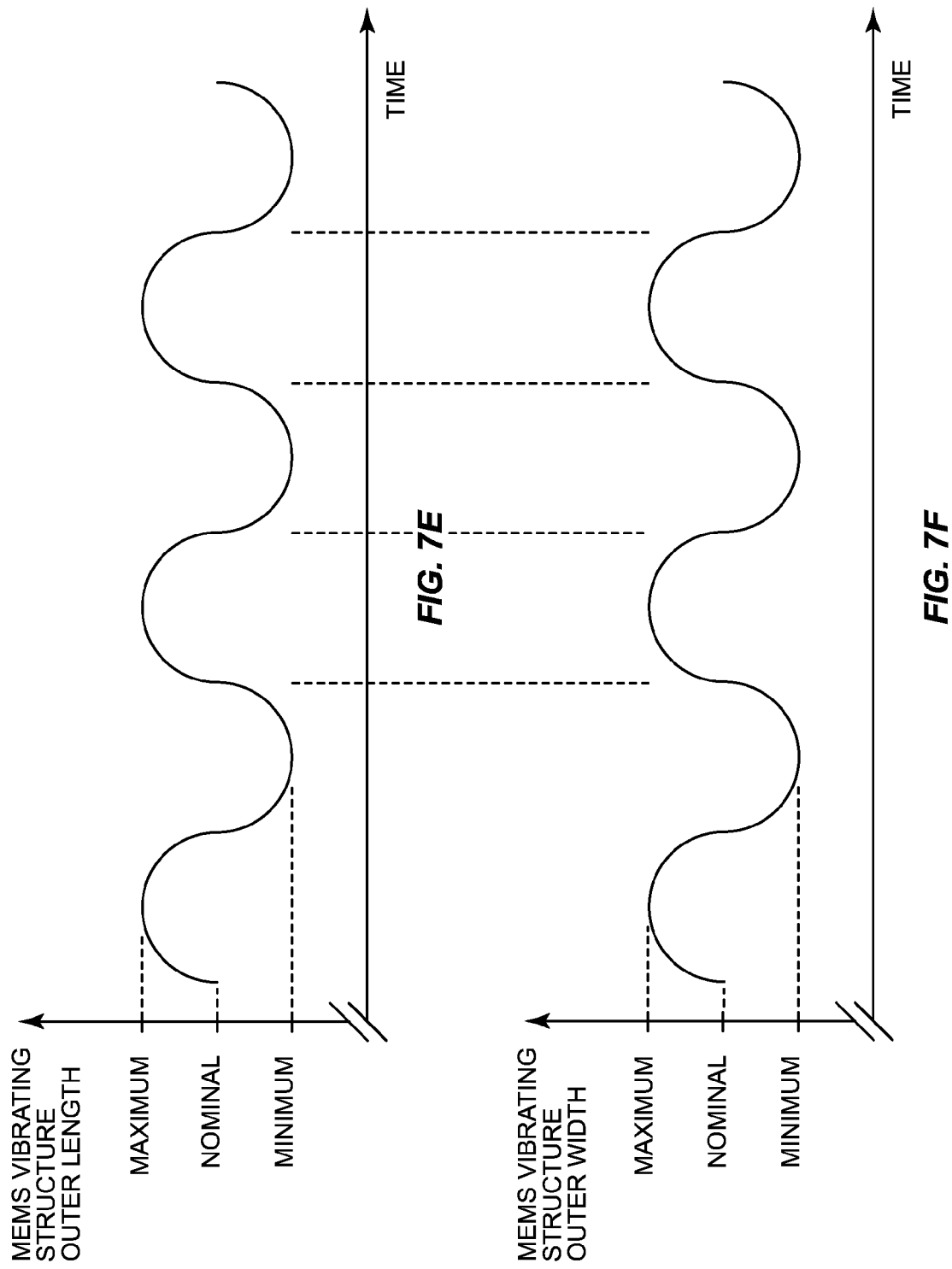

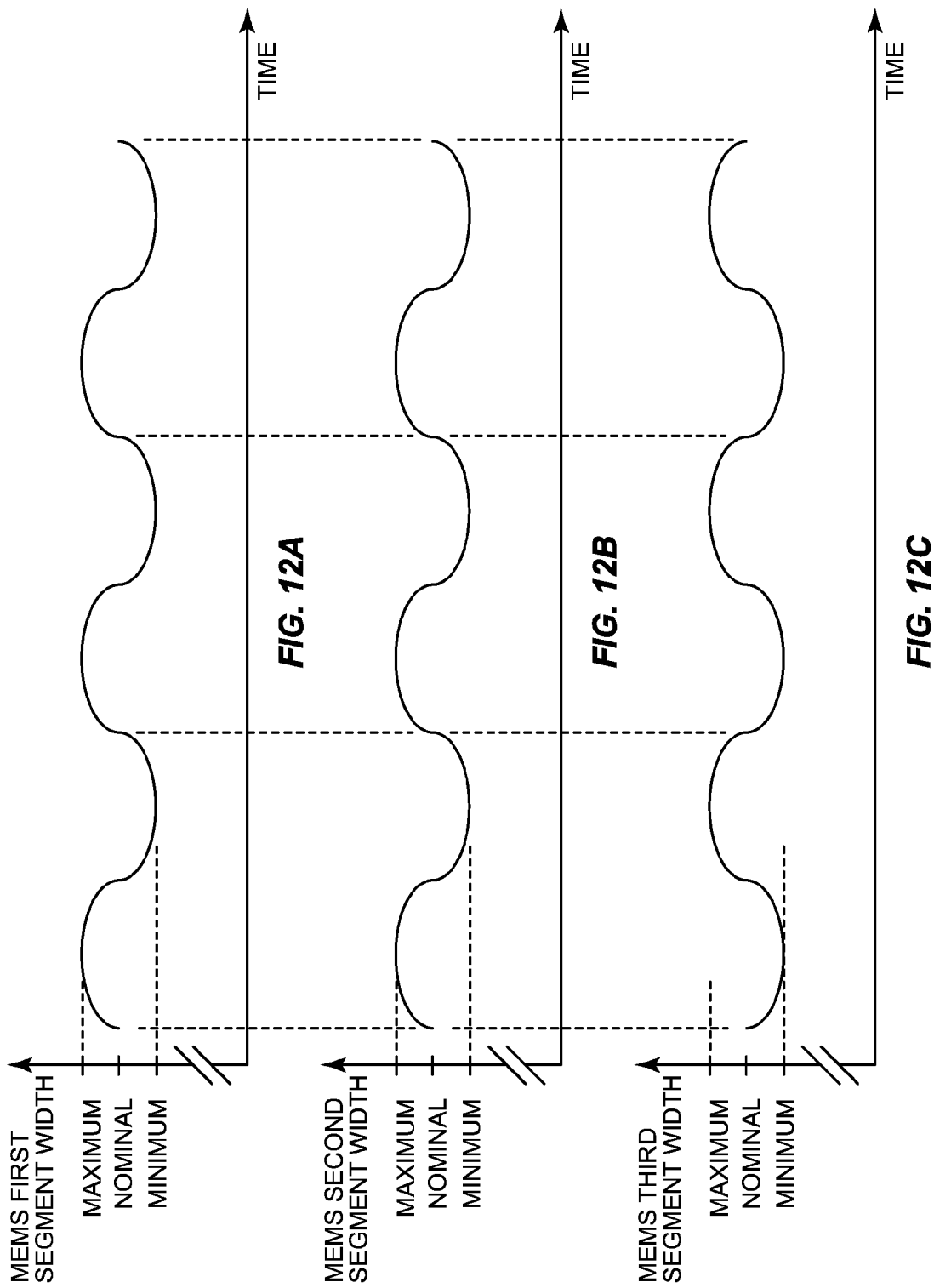

US 9,391,588 B2

MEMS VIBRATING STRUCTURE USING AN ORIENTATION DEPENDENT SINGLE-CRYSTAL PIEZOELECTRIC THIN FILM LAYER

RELATED APPLICATIONS

This application claims the benefit of provisional patent application No. 61/703,852, filed Sep. 21, 2012, and is a continuation-in-part of U.S. patent application Ser. No. 12/202,624 entitled METHOD FOR MANUFACTURING A VIBRATING MEMS CIRCUIT filed Sep. 2, 2008, which claims the benefit of provisional patent application No. 60/969,314 filed Aug. 31, 2007, the disclosures of which are hereby incorporated herein by reference in their entireties.

FIELD OF THE DISCLOSURE

Embodiments of the present disclosure relate to micro-electro-mechanical systems (MEMS) vibrating structures, such as MEMS sensors, MEMS resonators, MEMS oscillators, or MEMS filters, which may be used in radio frequency (RF) communications systems.

BACKGROUND OF THE DISCLOSURE

Resonators are devices that are often used in radio frequency (RF) circuitry in frequency reference circuits and filter circuits. Generally, resonators need to be high-Q, low loss, stable, have a low temperature coefficient of frequency, have high repeatability, have high accuracy, and have a low motional impedance. Additionally, RF circuits often require multiple resonators having different resonant frequencies. In some applications, such as RF filters, resonators need to have a wide bandwidth. Resonators having a high electromechanical coupling coefficient tend to have wide bandwidth.

One common type of resonator is a thin-film bulk acoustic resonator (FBAR), according to the prior art. An FBAR may use a piezoelectric thin-film material surrounded above and below with conductors. Aluminum Nitride may be deposited as a piezoelectric thin-film material; however, the FBAR may predominantly resonate in a thickness mode. Therefore, a resonant frequency of the FBAR may be dependent upon the thickness of a deposited Aluminum Nitride layer, which may be difficult to control. Additionally, a separate Aluminum Nitride layer may be needed for an additional FBAR having a different resonant frequency, which may be limiting or expensive.

An improvement on a traditional FBAR is an FBAR that uses a grown single-crystal FBAR (XBAR), which may have the advantages of good material uniformity, low material defect rates, high material stability, low loss, wide bandwidth, high repeatability, high-Q, and low drift. An alternative to the FBAR is a thin-film piezoelectric-on-substrate resonator (FPOSR), which uses a deposited thin-film, such as Zinc Oxide, on a suspended substrate. The FPOSR may resonate in either a thickness mode or a lateral mode. Lateral vibrations tend to be dependent on the size and shape of the resonator and not dependent upon the thickness of the resonator. However, the deposited thin-film of the FPOSR may have poor frequency stability, high losses, and may have a relatively low electromechanical coupling coefficient due to loading by a substrate layer.

A micro-electrical-mechanical system (MEMS) device includes at least one mechanical element, such as a sensor, an actuator, or a resonator that is formed using a micromachining process that selectively etches away parts of a wafer. The wafer may include added structural layers and may be made of a semiconductor material, such as Silicon. RF communications systems may use MEMS vibrating structures in MEMS resonators or filter circuits. MEMS resonators may be constructed mechanically to provide excellent acoustic isolation between an anchor and a vibrating structure, which may provide MEMS resonators with a very high-Q. Thus, there is a need for a MEMS resonator which is high-Q, low loss, stable, has a low temperature coefficient of frequency, has a high electromechanical coupling coefficient, has high repeatability, has high accuracy, and has a low motional impedance.

SUMMARY OF THE EMBODIMENTS

A micro-electrical-mechanical system (MEMS) vibrating structure includes a carrier substrate, a first anchor on a first surface of the carrier substrate, a second anchor on the first surface of the carrier substrate, a piezoelectric body suspended between the first anchor and the second anchor including a first surface parallel to and facing the carrier substrate and a second surface opposite the first surface, and only one conductive layer on the second surface of the piezoelectric body. The conductive layer includes a first inter-digitally dispersed section and a second inter-digitally dispersed section that are electrically isolated from one another. The piezoelectric body is formed from a single crystal with a uniform crystalline orientation defined by a first Euler angle ($\phi$), a second Euler angle ($\theta$), and a third Euler angle ($\psi$) such that the Euler angles satisfy the following equation:

$$|[\sin(\phi+n*120°)\cos\psi+\cos(\phi+n*120°)\cos\theta\sin\psi] \cos(38°)+\sin\theta\sin\psi\sin(38°)| \geq \cos(27°)$$

where n=−1, 0, 1.

According to one embodiment, the MEMS vibrating structure is adapted to predominately vibrate in a longitudinal mode of operation.

A micro-electrical-mechanical system (MEMS) vibrating structure includes a carrier substrate, a first anchor on a first surface of the carrier substrate, a second anchor on the first surface of the carrier substrate, a piezoelectric body suspended between the first anchor and the second anchor including a first surface parallel to and facing the carrier substrate and a second surface opposite the first surface, and only one conductive layer on the second surface of the piezoelectric body. The conductive layer includes a first inter-digitally dispersed section and a second inter-digitally dispersed section that are electrically isolated from one another. The piezoelectric body is formed from a single crystal with a uniform crystalline orientation defined by a first Euler angle ($\phi$), a second Euler angle ($\theta$), and a third Euler angle ($\psi$) such that the Euler angles satisfy the following equation:

$$|\sin\theta\sin\psi| \leq \cos 45°$$

$$|\sin(\phi+n*120°)\sin\psi+\sqrt{3}\sin\theta\cos\psi-\cos(\phi+n*120°) \cos\theta\cos\psi| \geq 1$$

where n=−1, 0, 1.

According to one embodiment, the MEMS vibrating structure is adapted to predominantly vibrate in a shear-horizontal mode of operation.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
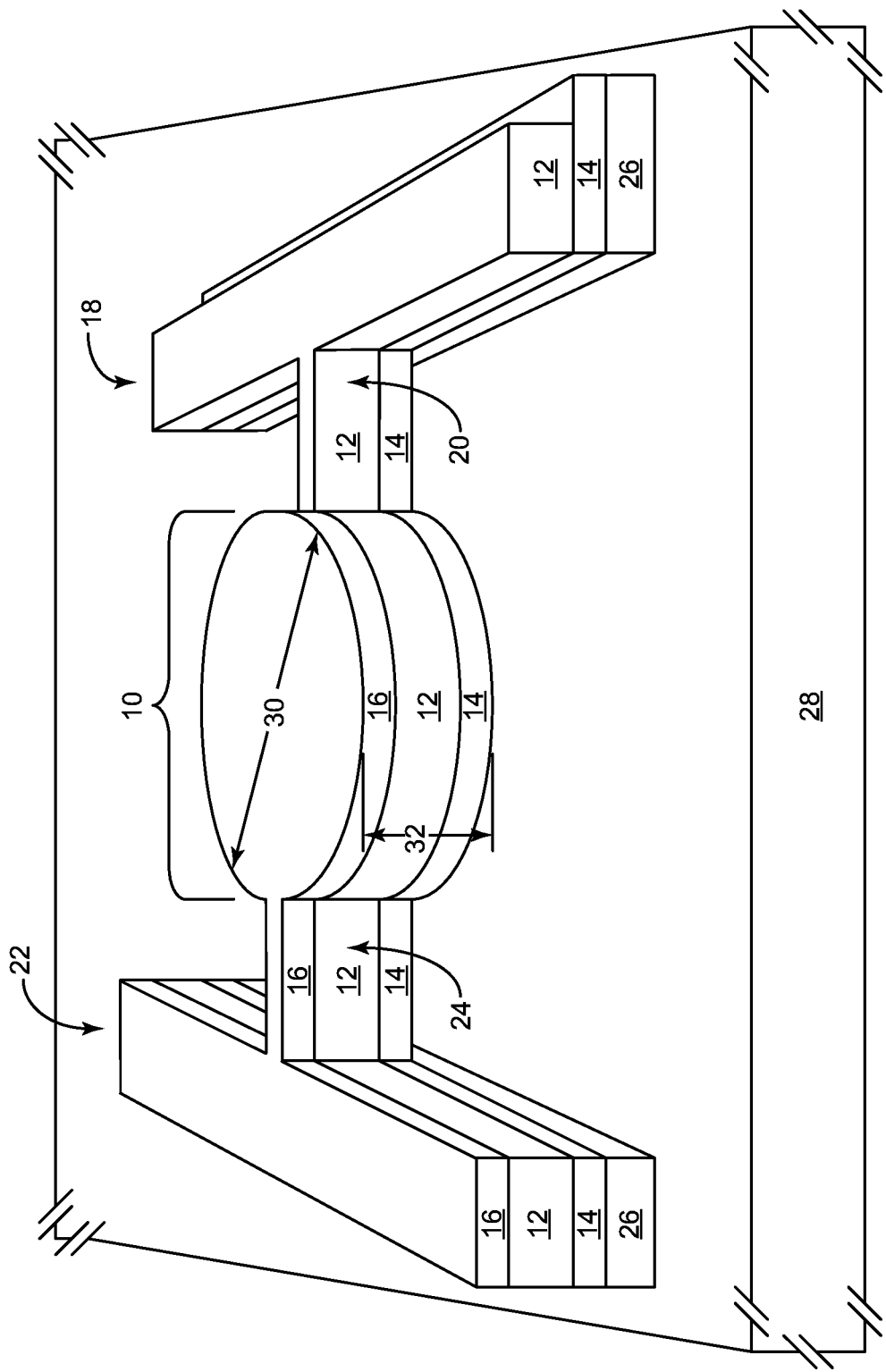
FIG. 1 shows a three-dimensional view of a disk-shaped micro-electro-mechanical systems (MEMS) vibrating structure, according to one embodiment of the present disclosure.
Figure 4:
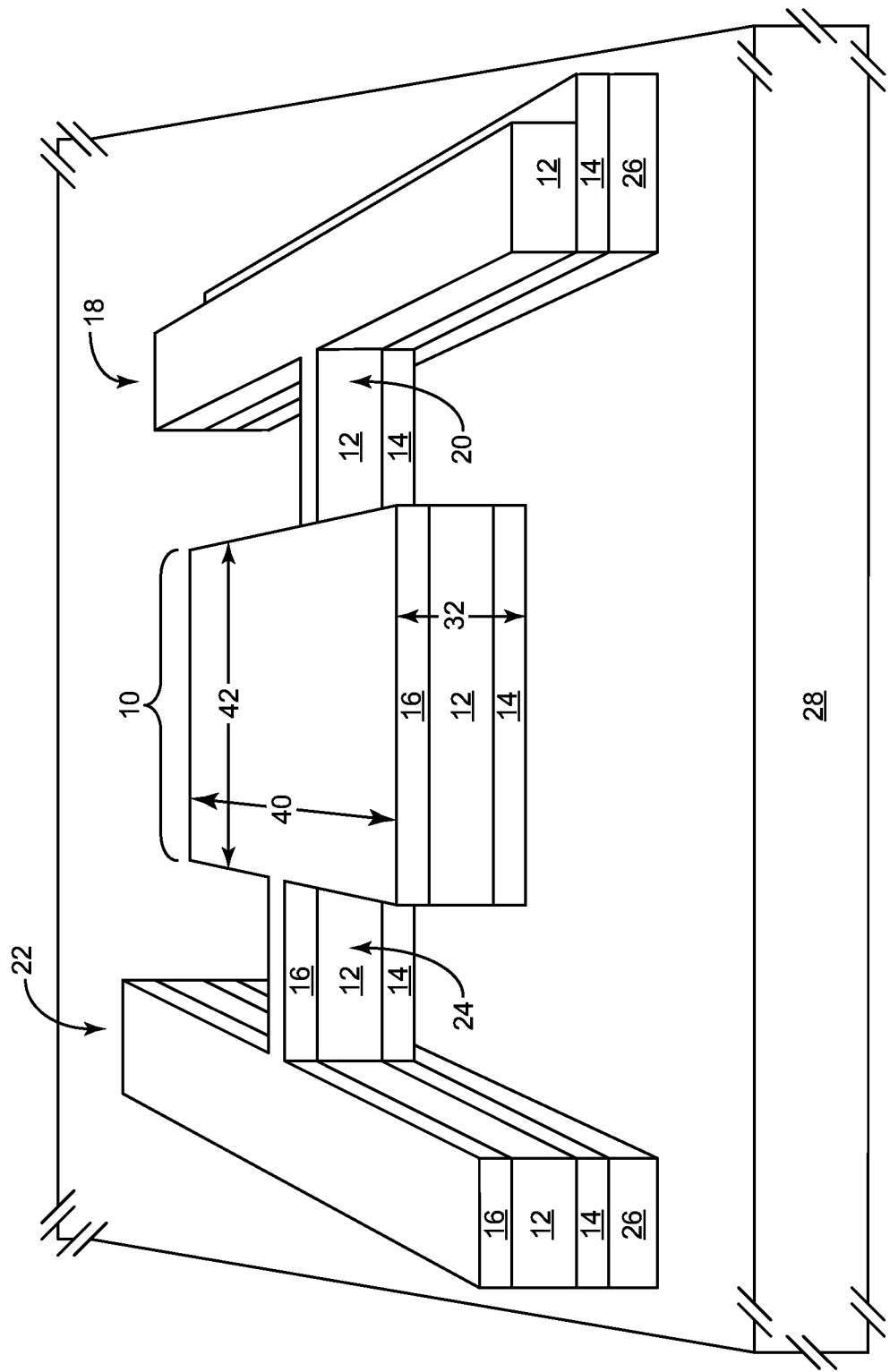
FIG. 4 shows a three-dimensional view of a square-shaped MEMS vibrating structure, according to another embodiment of the present disclosure.

FIGS. 7A, 7B, 7C, 7D, 7E, and 7F are graphs illustrating how the MEMS vibrating structures illustrated in FIGS. 1 and 4 vary with time.

Figure 8:
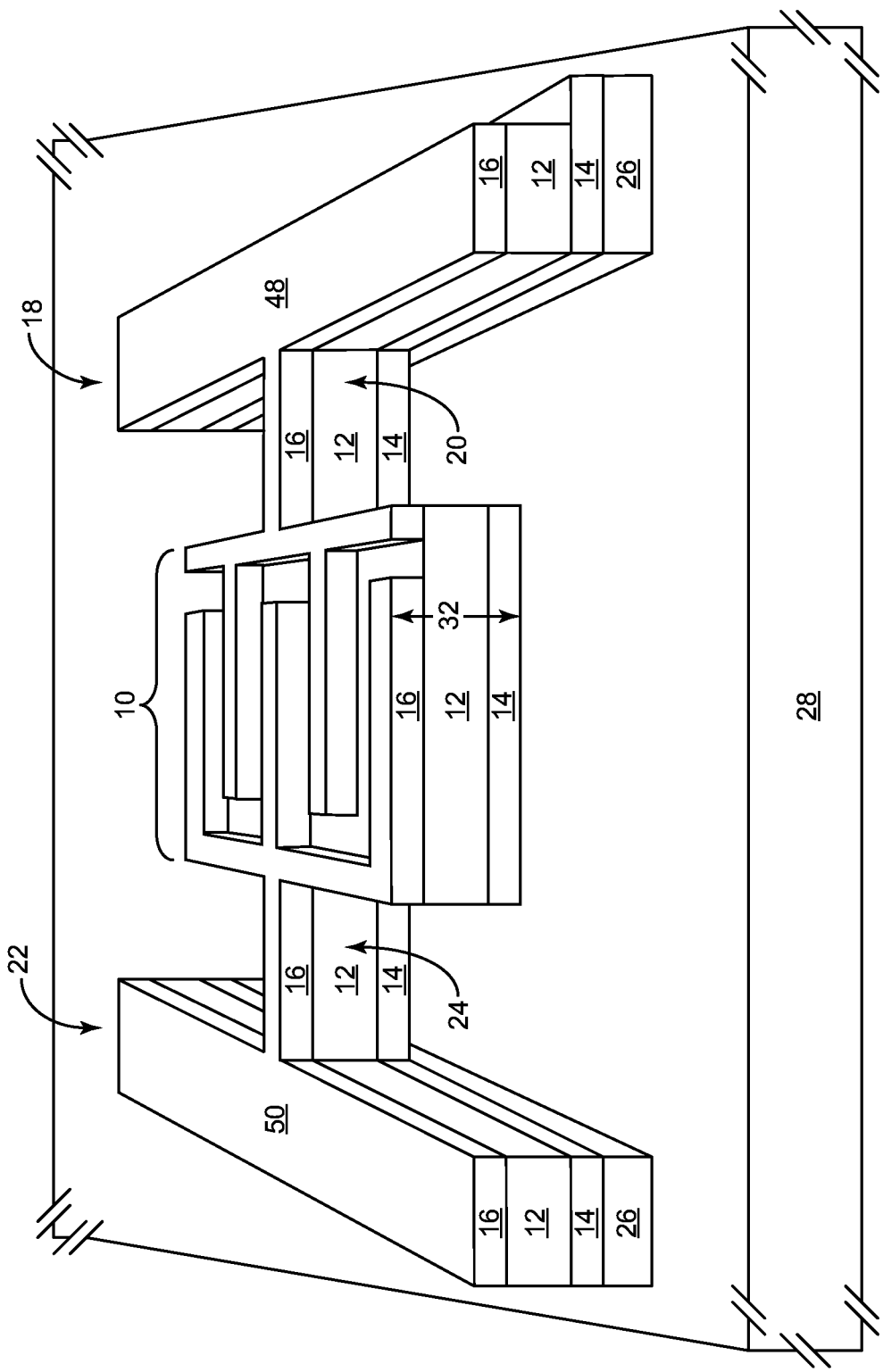

FIG. 8 shows a three-dimensional view of an inter-digital-transducer (IDT) MEMS vibrating structure, according to one embodiment of the present disclosure.

Figure 9:
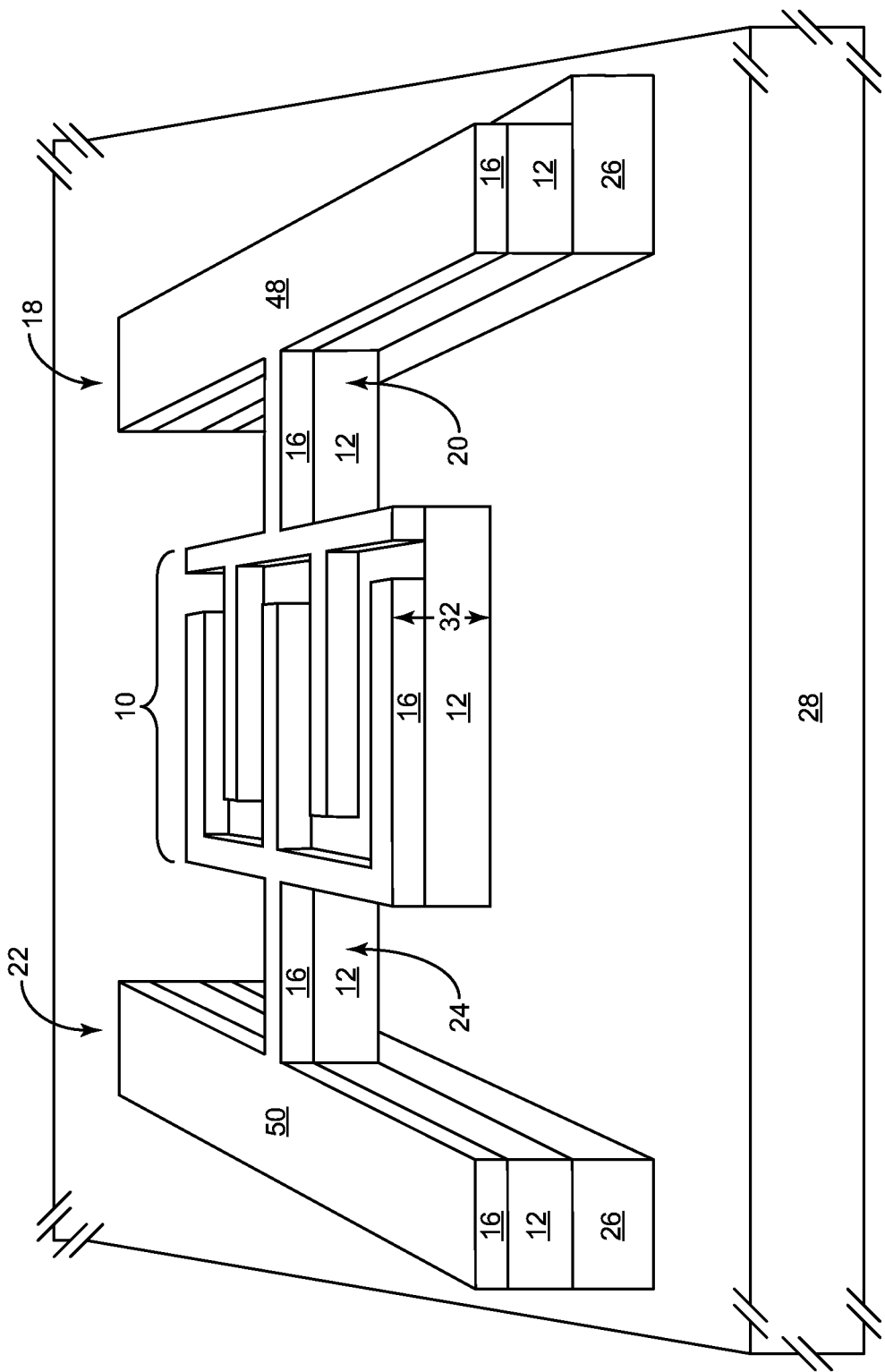

FIG. 9 shows a three-dimensional view of an IDT MEMS vibrating structure according to an additional embodiment of the present disclosure.

Figure 10:
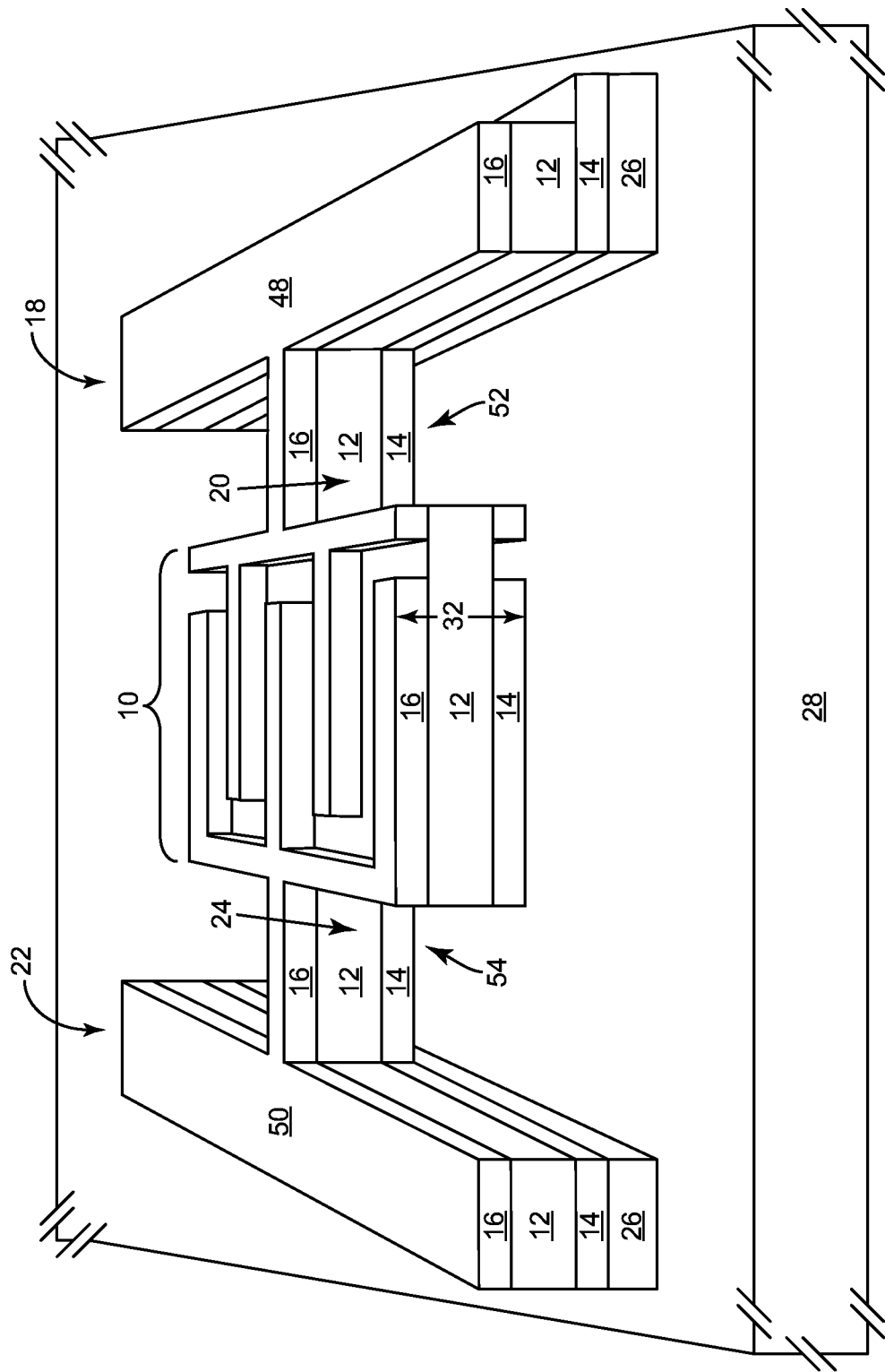

FIG. 10 shows a three-dimensional view of an IDT MEMS vibrating structure according to an additional embodiment of the present disclosure.

Figure 11A:
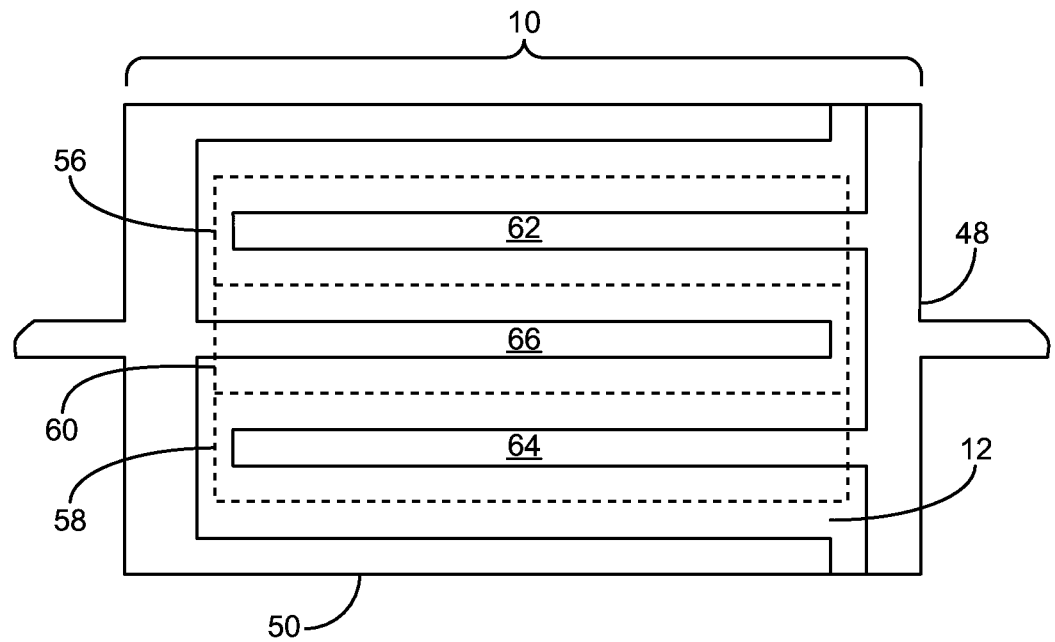

FIG. 11A shows a top view of the IDT MEMS vibrating structure illustrated in FIGS. 8-10.

Figure 11B:
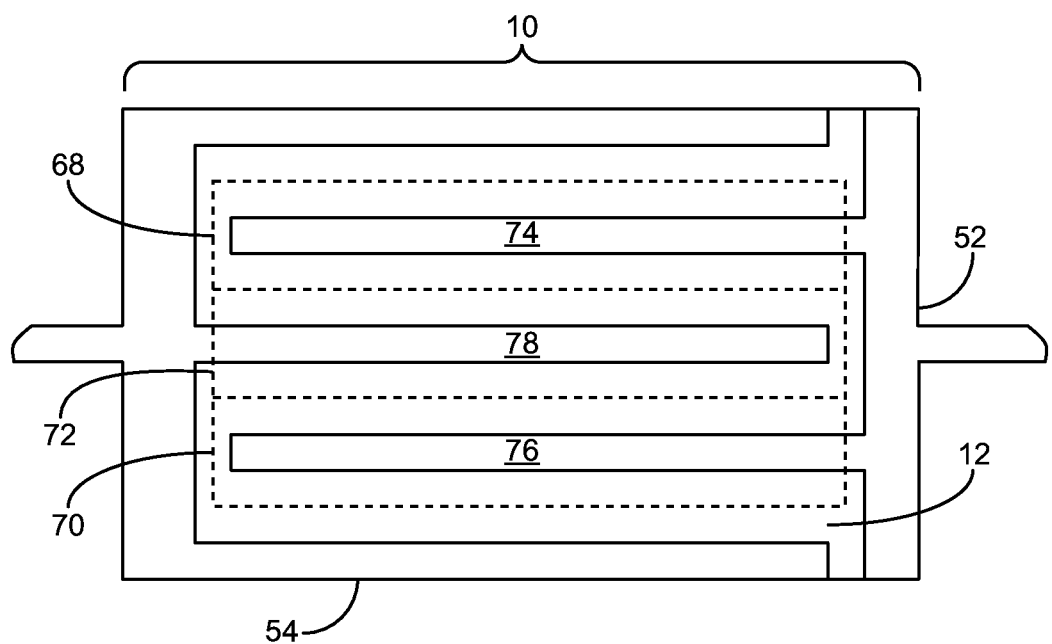

FIG. 11B shows a bottom view of the IDT MEMS vibrating structure illustrated in FIG. 10.

FIGS. 12A, 12B, and 12C are graphs illustrating how MEMS first, second, and third segment widths vary with time.

FIGS. 13A, 13B, 13C, 13D, 13E, and 13F show Cartesian Coordinate Systems for illustrating orientations of a uniform crystalline structure of a single-crystal piezoelectric thin-film layer relative to the MEMS vibrating structures illustrated in FIGS. 1, 3, 4, 5, 6, 8, 9, and 10.

Figure 14:
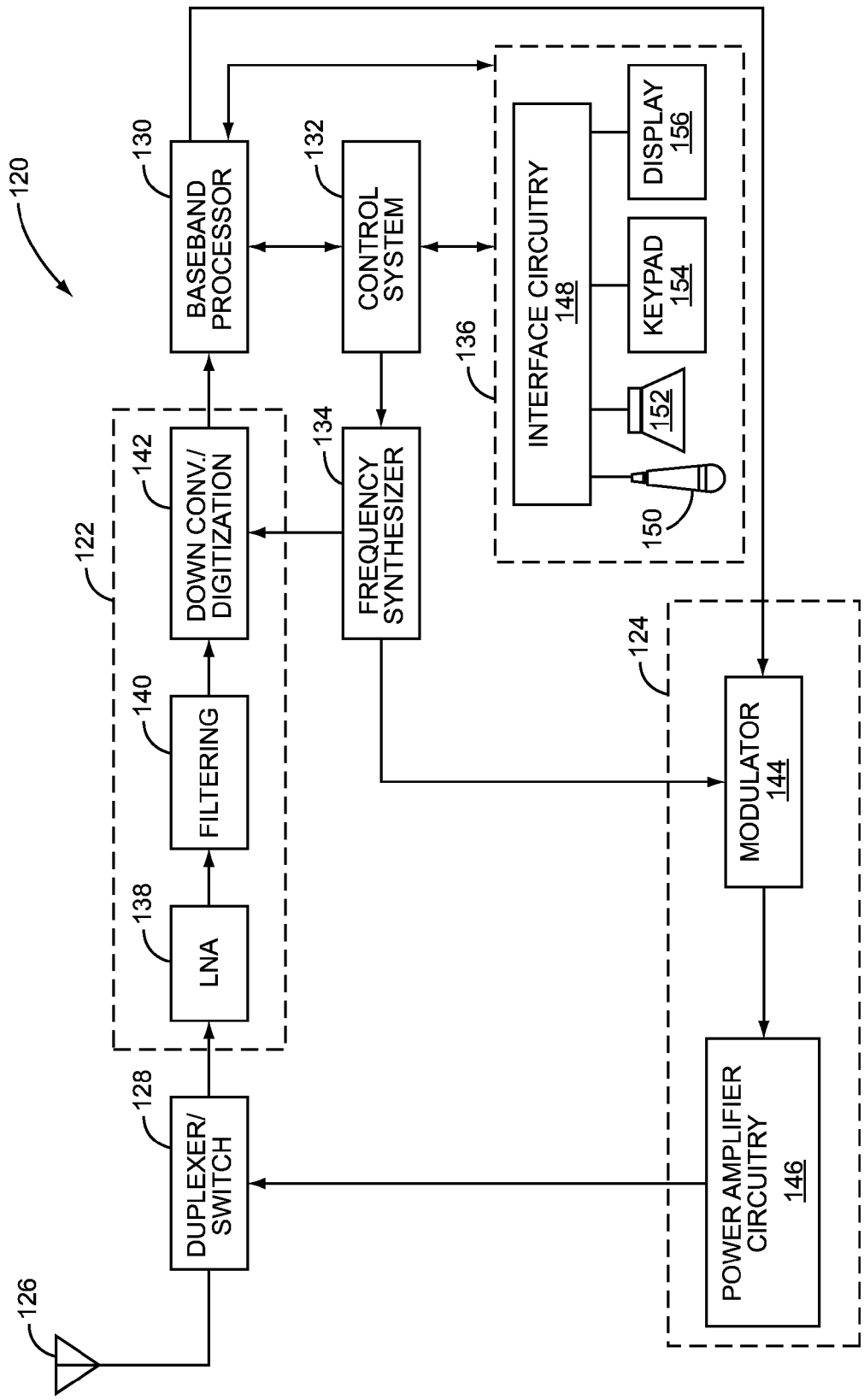

FIG. 14 shows an application example of the present disclosure used in a mobile terminal.

DETAILED DESCRIPTION OF THE PREFERRED EMBODIMENTS

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to a micro-electrical-mechanical system (MEMS) vibrating structure supported by a MEMS anchor system, and includes a single-crystal piezoelectric thin-film layer that has a specific non-standard crystal orientation, which may be selected to increase an electromechanical coupling coefficient, decrease a temperature coefficient of frequency, or both. The MEMS vibrating structure may have dominant lateral vibrations or dominant thickness vibrations. The single-crystal piezoelectric thin-film layer may include Lithium Tantalate or Lithium Niobate, and may provide MEMS vibrating structures with precise sizes and shapes, which may provide high accuracy and enable fabrication of multiple resonators having different resonant frequencies on a single substrate.

Since the MEMS vibrating structure is formed from a single-crystal material and uses mechanically efficient MEMS construction, the MEMS vibrating structure may be high-Q, low loss, stable, have a low temperature coefficient of frequency, have a high electromechanical coupling coefficient, have high repeatability, and have a low motional impedance. In one embodiment of the present disclosure, a non-standard crystalline orientation of the single-crystal piezoelectric thin-film may be used to provide specific vibrational characteristics, such as a low temperature coefficient of frequency, a high electromechanical coupling coefficient, or both.

The single-crystal piezoelectric thin-film layer has piezoelectric properties, such that an applied alternating current (AC) voltage may cause mechanical vibrations, and the single-crystal piezoelectric thin-film layer may include Lithium Tantalate or Lithium Niobate for their desirable properties. The single-crystal piezoelectric thin-film layer may be in contact with a single conductive layer, or sandwiched between two conductive layers, such as metallization layers. The single-crystal piezoelectric thin-film layer is a principal resonating layer and may provide the dominant resonant characteristics of the MEMS vibrating structure.

The single-crystal piezoelectric thin-film layer may be driven with an AC voltage to operate as a piezoelectric transducer, or may be additionally driven with a direct current (DC) voltage to operate additionally as an electrostatic transducer based on the capacitance established by the single-crystal piezoelectric thin-film layer. An electrostatic transducer requires both AC and DC voltages for proper operation.

Crystals which acquire a charge when compressed, twisted, or distorted are said to be piezoelectric. This property provides a transducer effect between electrical and mechanical oscillations or vibrations. In a piezoelectric transducer, an applied AC voltage will cause mechanical vibrations in the transducer, which will present an impedance response to the circuitry providing the AC voltage that is dependent on mechanical resonances in the piezoelectric transducer. The impedance response may be called a motional impedance. Additionally, the piezoelectric transducer will present an impedance response, called an electrical impedance, to the circuitry providing the AC voltage that is based on the electrical characteristics of the piezoelectric transducer. The motional impedance and the electrical impedance combine to provide a total impedance presented to the circuitry providing the AC voltage.

An electrostatic transducer is similar to a piezoelectric transducer. In a piezoelectric transducer, charges in a piezoelectric material are produced from mechanical movements in the piezoelectric material. In an electrostatic transducer, charges in a dielectric material, which is enclosed on either side with conducting materials to form a capacitor, are produced from an applied DC voltage across the dielectric material. Mechanical vibrations in the electrostatic transducer will vary the capacitance of the transducer, which will present an impedance response to the circuitry providing the DC voltage across the material that is dependent on mechanical vibrations in the transducer.

If a piezoelectric transducer and an electrostatic transducer are combined into a single transducer using a common crystal material, then the single transducer will have a piezoelectric impedance that is dependent on mechanical and piezoelectric properties of the transducer and the frequency and magnitude of an AC voltage applied across the transducer, and an electrostatic impedance that is dependent on mechanical and electrical properties, such as a dielectric constant, of the transducer and the magnitude of a DC voltage applied across the transducer. The DC voltage may be varied to fine tune the piezoelectric impedance. Additionally, the DC voltage may be modulated with a low frequency signal that is effectively mixed with the AC voltage.

FIG. 1 shows a three-dimensional view of a MEMS vibrating structure 10 according to one embodiment of the present disclosure. The MEMS vibrating structure 10 includes a single-crystal piezoelectric thin-film layer 12 that is sandwiched between a first conducting layer 14 and a second conducting layer 16. A first supporting structure includes a first anchor 18 and a first mechanical support member 20 between the MEMS vibrating structure 10 and the first anchor 18. A second supporting structure includes a second anchor 22 and a second mechanical support member 24 between the MEMS vibrating structure 10 and the second anchor 22. An insulating layer 26 is located over a substrate 28 and may be etched to provide attachment points for the first and second anchors 18, 22. The first supporting structure includes the first conducting layer 14 and the single-crystal piezoelectric thin-film layer 12. The second supporting structure includes the first and second conducting layers 14, 16 and the single-crystal piezoelectric thin-film layer 12. The MEMS vibrating structure 10 is suspended between the first and second anchors 18, 22. In alternate embodiments of the present disclosure, the MEMS vibrating structure 10 may be suspended between three or more anchors, or suspended from a single anchor.

The single-crystal piezoelectric thin-film layer 12 may have been cut from a boule that was grown with a specific uniform crystal orientation. The wafer cut, such as a Z-cut, a Y-cut, or any rotated cut, the shape, and the thickness of the single-crystal piezoelectric thin-film layer 12 in the MEMS vibrating structure 10 determine a uniform crystalline orientation of the single-crystal piezoelectric thin-film layer 12 in the MEMS vibrating structure 10, which may determine the vibrational characteristics of the MEMS vibrating structure 10. Additionally, the wafer material, such as Lithium Tantalate or Lithium Niobate, may determine the vibrational characteristics of the MEMS vibrating structure 10. Different vibrational characteristics may be used for different applications, such as resonators, oscillators, filters, or sensors. Historically, a standard uniform crystalline orientation of the single-crystal piezoelectric thin-film layer 12 may have been used as a result of using standard wafer cuts, such as a Z-cut, a Y-cut, or a 45 degree rotated Y-cut. However, in one embodiment of the present disclosure, a non-standard uniform crystalline orientation of the single-crystal piezoelectric thin-film layer 12 may be used to provide specific vibrational characteristics, such as a low temperature coefficient of frequency, a high electromechanical coupling coefficient, or both.

The non-standard uniform crystalline orientation of the single-crystal piezoelectric thin-film layer 12 may be selected to provide at least one defined characteristic of the MEMS vibrating structure 10. Defined characteristics of the MEMS vibrating structure 10 may include a minimized temperature coefficient of frequency of the MEMS vibrating structure 10, a temperature coefficient of frequency of the MEMS vibrating structure 10 below an acceptance threshold, a maximized electromechanical coupling coefficient of the MEMS vibrating structure 10, an electromechanical coupling coefficient of the MEMS vibrating structure 10 above an acceptance threshold, a maximized electromechanical coupling coefficient of the MEMS vibrating structure 10 to provide a maximized bandwidth of the MEMS vibrating structure 10, an electromechanical coupling coefficient of the MEMS vibrating structure 10 to provide a bandwidth of the MEMS vibrating structure 10 above an acceptance threshold, or any combination thereof.

The maximized bandwidth, the bandwidth above an acceptance threshold, the acceptance threshold, or any combination thereof, may be expressed as an absolute bandwidth, such as kilohertz or megahertz, or as a relative bandwidth, such as a percentage or ratio of an absolute bandwidth divided by a frequency. For example, a MEMS vibrating structure 10 may be used to form a bandpass filter requiring a minimum of a one percent passband; therefore, the acceptance threshold would be one percent. If the bandpass filter had a one gigahertz center frequency, then the bandwidth of the bandpass filter would need to be at least ten megahertz.

One vibrational characteristic is resonant frequency. The single-crystal piezoelectric thin-film layer 12 in the MEMS vibrating structure 10 may have at least one resonant region (not shown) having at least one resonant frequency. Another vibrational characteristic is the electromechanical coupling coefficient, which relates the mechanical characteristics to the electrical characteristics of the MEMS vibrating structure 10, and may be useful for radio frequency (RF) filter applications or high-Q RF circuits. An additional vibrational characteristic is the dominant mode of vibration. In a first embodiment of the MEMS vibrating structure 10, the shape of the MEMS vibrating structure 10 is a disk having an outer diameter 30 and a thickness 32, as illustrated in FIG. 1. The dominant mode of vibration is a contour mode of vibration, which is one form of lateral vibration, wherein the outer diameter 30 varies as the MEMS vibrating structure 10 vibrates.

Figure 2:
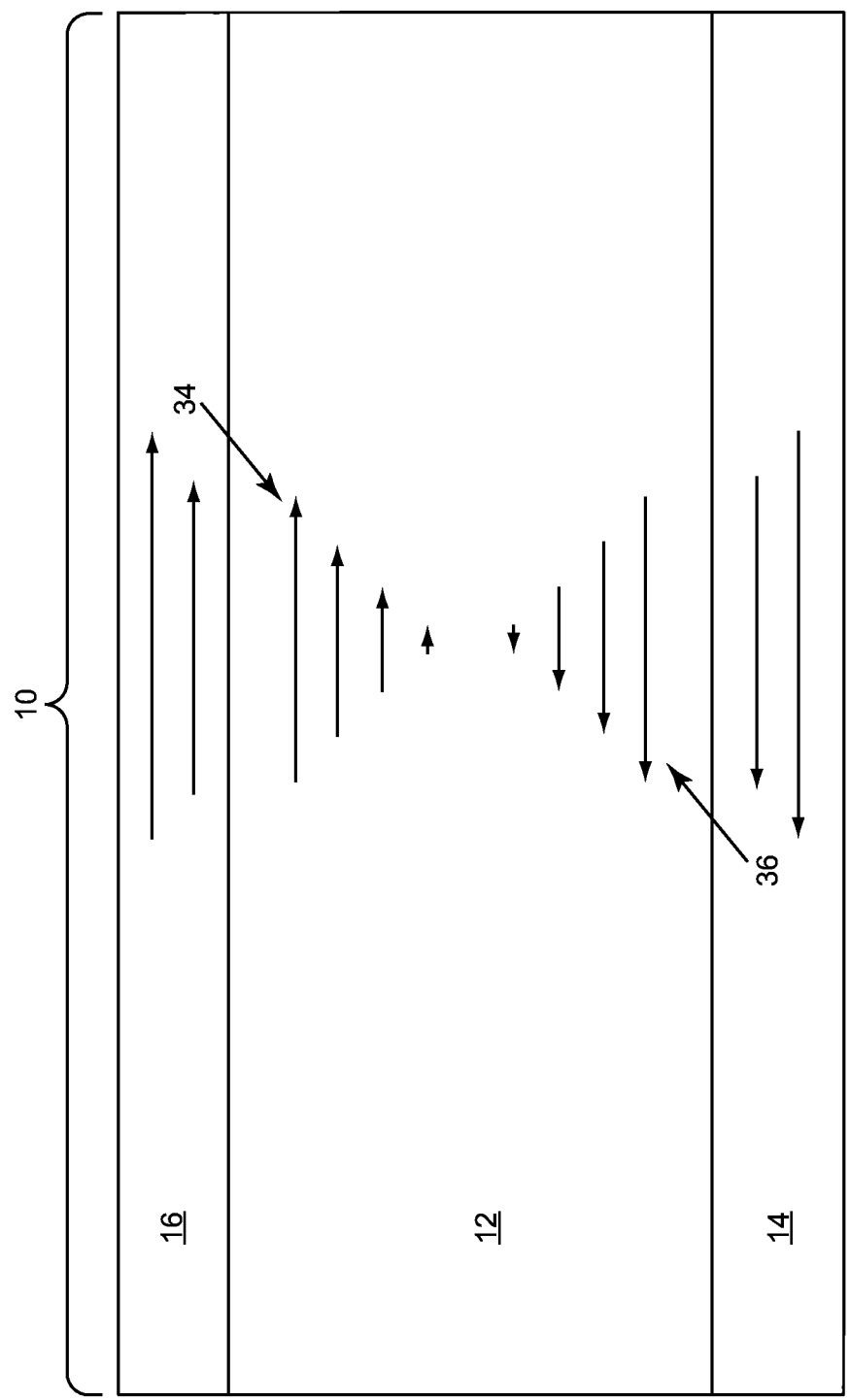
FIG. 2 shows the MEMS vibrating structure vibrating with thickness-shear mode vibrations, according to one embodiment of the present disclosure.

In a second embodiment of the MEMS vibrating structure 10, the shape of the MEMS vibrating structure 10 is the disk having the outer diameter 30 and the thickness 32, as illustrated in FIG. 1. The dominant mode of vibration is a thickness-extensional mode of vibration, which is one form of thickness vibration, wherein the thickness 32 varies as the MEMS vibrating structure 10 vibrates. In a third embodiment of the MEMS vibrating structure 10, the shape of the MEMS vibrating structure 10 is the disk having the outer diameter 30 and the thickness 32, as illustrated in FIG. 1. The dominant mode of vibration is a thickness-shear mode of vibration, which is one form of thickness vibration, wherein as the MEMS vibrating structure 10 vibrates, the top of the single-crystal piezoelectric thin-film layer 12 in the MEMS vibrating structure 10 moves laterally in one direction 34, while the bottom of the single-crystal piezoelectric thin-film layer 12 moves in an opposite direction 36, as illustrated in FIG. 2.

Figure 3:
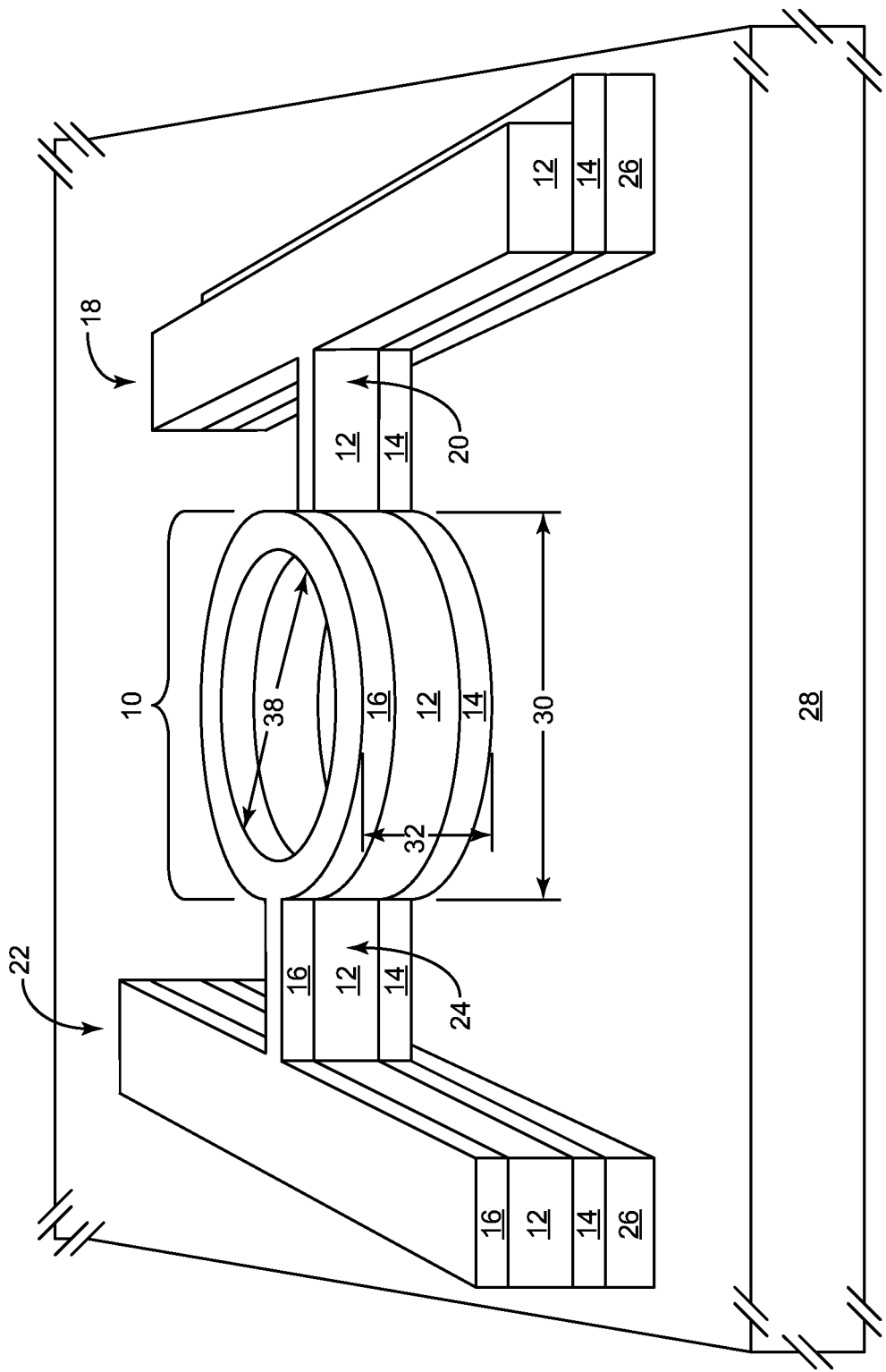
FIG. 3 shows a three-dimensional view of a circular ring-shaped MEMS vibrating structure, according to an alternate embodiment of the present disclosure.

In a fourth embodiment of the MEMS vibrating structure 10, the shape of the MEMS vibrating structure 10 is a circular ring having the outer diameter 30, an inner diameter 38, and the thickness 32, as illustrated in FIG. 3. The dominant mode of vibration is a contour mode of vibration, which is one form of lateral vibration, wherein the outer diameter 30, the inner diameter 38, or both, vary as the MEMS vibrating structure 10 vibrates.

In a fifth embodiment of the MEMS vibrating structure 10, the shape of the MEMS vibrating structure 10 is the circular ring, as illustrated in FIG. 3. The dominant mode of vibration is a thickness-extensional mode of vibration, which is one form of thickness vibration, wherein the thickness 32 varies as the MEMS vibrating structure 10 vibrates. In a sixth embodiment of the MEMS vibrating structure 10, the shape of the MEMS vibrating structure 10 is the circular ring, as illustrated in FIG. 3. The dominant mode of vibration is a thickness-shear mode of vibration, which is one form of thickness vibration, wherein as the MEMS vibrating structure 10 vibrates, the top of the single-crystal piezoelectric thin-film layer 12 in the MEMS vibrating structure 10 moves laterally in one direction 34, while the bottom of the single-crystal piezoelectric thin-film layer 12 moves in the opposite direction 36, as illustrated in FIG. 2.

In a seventh embodiment of the MEMS vibrating structure 10, the shape of the MEMS vibrating structure 10 is a square having an outer length 40, an outer width 42, and the thickness 32, as illustrated in FIG. 4. The MEMS vibrating structure 10 may be bisected along the outer length 40 of the MEMS vibrating structure 10 by the first and second mechanical support members 20, 24. The outer length 40 may be about equal to the outer width 42. The dominant mode of vibration is a contour mode of vibration, which is one form of lateral vibration, wherein the outer length 40 and the outer width 42 vary as the MEMS vibrating structure 10 vibrates. In an eighth embodiment of the MEMS vibrating structure 10, the shape of the MEMS vibrating structure 10 is the square, as illustrated in FIG. 4. The dominant mode of vibration is a length-extensional mode of vibration, which is one form of lateral vibration, wherein the outer length 40 varies as the MEMS vibrating structure 10 vibrates. In a ninth embodiment of the MEMS vibrating structure 10, the shape of the MEMS vibrating structure 10 is the square, as illustrated in FIG. 4. The dominant mode of vibration is a width-extensional mode of vibration, which is one form of lateral vibration, wherein the outer width 42 varies as the MEMS vibrating structure 10 vibrates.

In a tenth embodiment of the MEMS vibrating structure 10, the shape of the MEMS vibrating structure 10 is the square, as illustrated in FIG. 4. The dominant mode of vibration is a thickness-extensional mode of vibration, which is one form of thickness vibration, wherein the thickness 32 varies as the MEMS vibrating structure 10 vibrates. In an eleventh embodiment of the MEMS vibrating structure 10, the shape of the MEMS vibrating structure 10 is the square, as illustrated in FIG. 4. The dominant mode of vibration is a thickness-shear mode of vibration, which is one form of thickness vibration, wherein as the MEMS vibrating structure 10 vibrates, the top of the single-crystal piezoelectric thin-film layer 12 in the MEMS vibrating structure 10 moves laterally in one direction 34, while the bottom of the single-crystal piezoelectric thin-film layer 12 moves in the opposite direction 36, as illustrated in FIG. 2.

Figure 5:
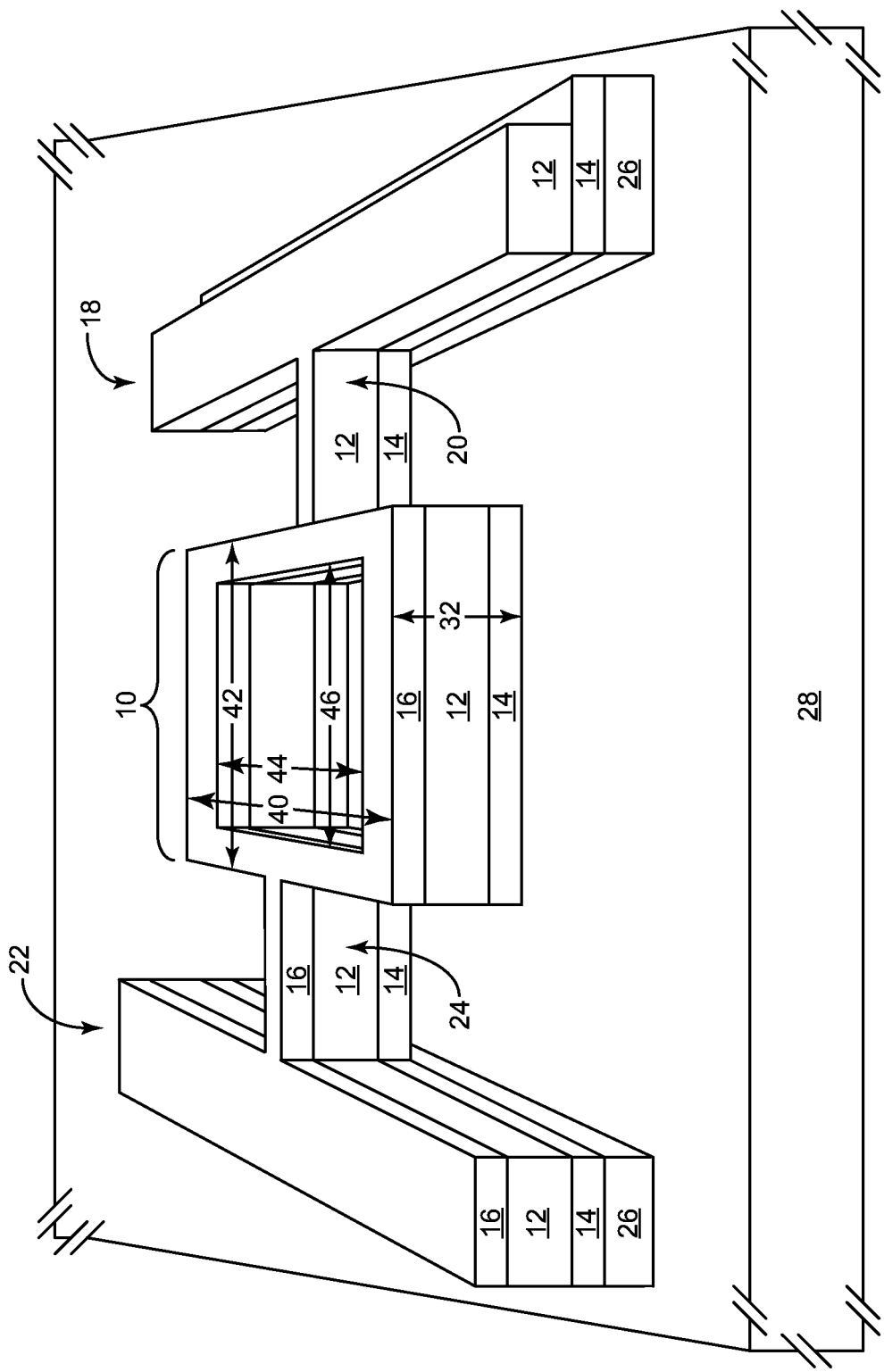
FIG. 5 shows a three-dimensional view of a square ring-shaped MEMS vibrating structure, according to a supplemental embodiment of the present disclosure.

In a twelfth embodiment of the MEMS vibrating structure 10, the shape of the MEMS vibrating structure 10 is a square ring having the outer length 40, the outer width 42, an inner length 44, an inner width 46, and the thickness 32, as illustrated in FIG. 5. The MEMS vibrating structure 10 may be bisected along the outer length 40 of the MEMS vibrating structure 10 by the first and second mechanical support members 20, 24. The dominant mode of vibration is a contour mode of vibration, which is one form of lateral vibration, wherein the outer length 40, the outer width 42, the inner length 44, the inner width 46, or any combination thereof may vary as the MEMS vibrating structure 10 vibrates.

In a thirteenth embodiment of the MEMS vibrating structure 10, the shape of the MEMS vibrating structure 10 is the square ring, as illustrated in FIG. 5. The dominant mode of vibration is a thickness-extensional mode of vibration, which is one form of thickness vibration, wherein the thickness 32 varies as the MEMS vibrating structure 10 vibrates. In a fourteenth embodiment of the MEMS vibrating structure 10, the shape of the MEMS vibrating structure 10 is the square ring, as illustrated in FIG. 5. The dominant mode of vibration is a thickness-shear mode of vibration, which is one form of thickness vibration, wherein as the MEMS vibrating structure 10 vibrates, the top of the single-crystal piezoelectric thin-film layer 12 in the MEMS vibrating structure 10 moves laterally in one direction 34, while the bottom of the single-crystal piezoelectric thin-film layer 12 moves in the opposite direction 36, as illustrated in FIG. 2.

Figure 6:
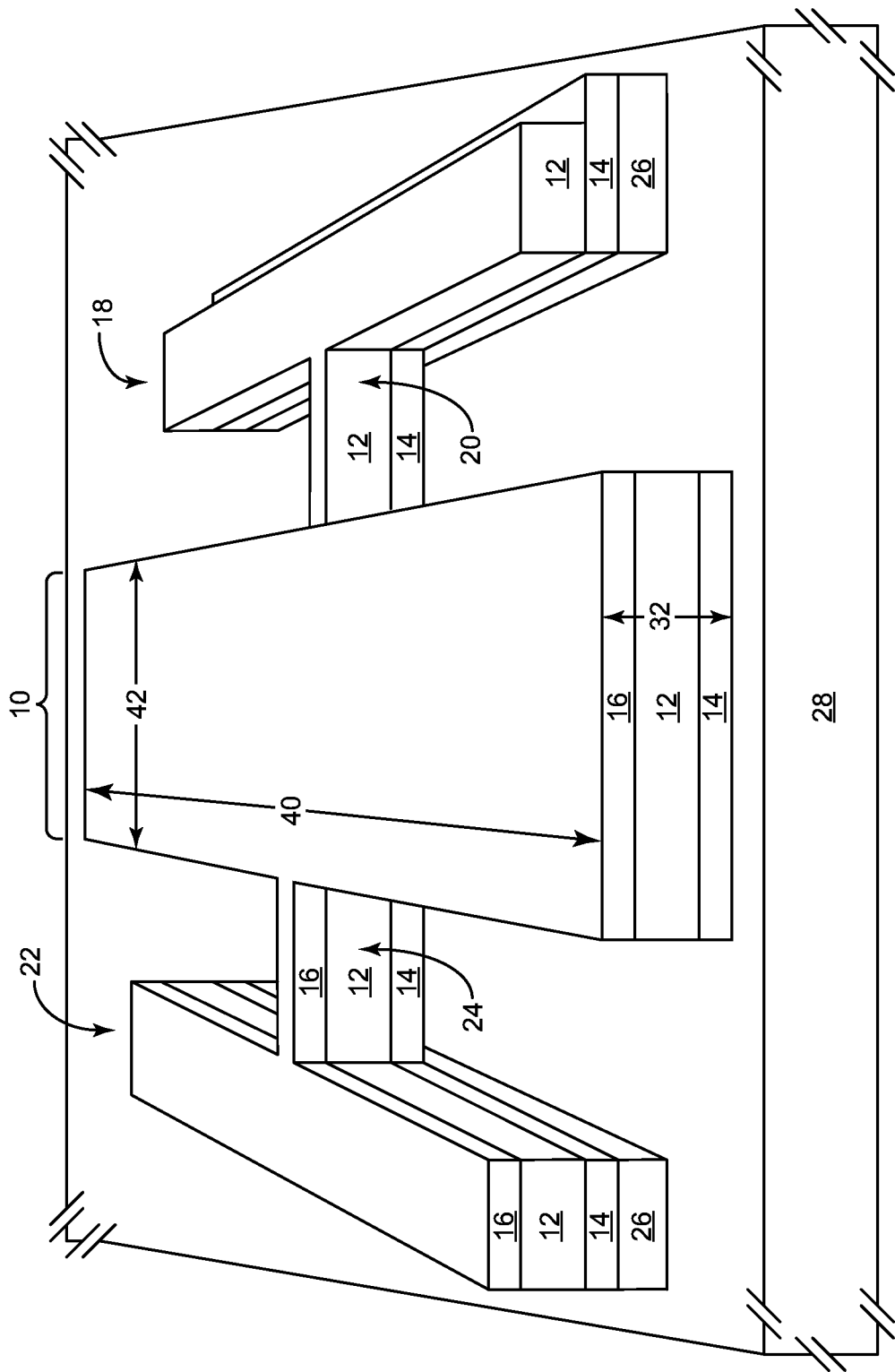
FIG. 6 shows a three-dimensional view of a rectangular-shaped MEMS vibrating structure, according to an additional embodiment of the present disclosure.

In a fifteenth embodiment of the MEMS vibrating structure 10, the shape of the MEMS vibrating structure 10 is a rectangle having the outer length 40, the outer width 42, and the thickness 32, as illustrated in FIG. 6. The MEMS vibrating structure 10 may be bisected along the outer length 40 of the MEMS vibrating structure 10 by the first and second mechanical support members 20, 24. The outer length 40 may be longer than the outer width 42. The dominant mode of vibration is a length-extensional mode of vibration, which is one form of lateral vibration, wherein the outer length 40 varies as the MEMS vibrating structure 10 vibrates. In a sixteenth embodiment of the MEMS vibrating structure 10, the shape of the MEMS vibrating structure 10 is the rectangle, as illustrated in FIG. 6. The dominant mode of vibration is a width-extensional mode of vibration, which is one form of lateral vibration, wherein the outer width 42 varies as the MEMS vibrating structure 10 vibrates.

In a seventeenth embodiment of the MEMS vibrating structure 10, the shape of the MEMS vibrating structure 10 is the rectangle, as illustrated in FIG. 6. The dominant mode of vibration is a thickness-extensional mode of vibration, which is one form of thickness vibration, wherein the thickness 32 varies as the MEMS vibrating structure 10 vibrates. In an eighteenth embodiment of the MEMS vibrating structure 10, the shape of the MEMS vibrating structure 10 is the rectangle, as illustrated in FIG. 6. The dominant mode of vibration is a thickness-shear mode of vibration, which is one form of thickness vibration, wherein as the MEMS vibrating structure 10 vibrates, the top of the single-crystal piezoelectric thin-film layer 12 in the MEMS vibrating structure 10 moves laterally in one direction 34, while the bottom of the single-crystal piezoelectric thin-film layer 12 moves in the opposite direction 36, as illustrated in FIG. 2.

In one embodiment of the MEMS vibrating structure 10, during a first active state, the MEMS vibrating structure 10 vibrates with dominant length-extensional mode vibrations, dominant width-extensional mode vibrations, dominant contour mode vibrations, dominant thickness-extensional mode vibrations, or dominant thickness-shear mode vibrations. Other vibrations may exist, but one vibrating mode will dominate. In other embodiments of the present disclosure, the MEMS vibrating structure 10 may be of any shape having any of the aforementioned vibrating modes. The MEMS vibrating structure 10 may be supported by any number of mechanical support members from any number of anchors. The mechanical support members may be attached to the MEMS vibrating structure 10 at any locations.

The first active state is entered by applying a driving AC voltage between the first conducting layer 14 and the second conducting layer 16 at the MEMS vibrating structure 10. The dominant vibrations may be caused by a piezoelectric effect produced by the driving AC voltage. A first inactive state exists when no driving AC voltage is applied. Typically, the driving AC voltage may be applied to the first conducting layer 14 on the first anchor 18, which is electrically attached to the first conducting layer 14 on the MEMS vibrating structure 10 through the first conducting layer 14 on the corresponding mechanical support member 20, 24. Likewise, the driving AC voltage may be applied to the second conducting layer 16 on the second anchor 22, which is electrically attached to the second conducting layer 16 on the MEMS vibrating structure 10 through the second conducting layer 16 on the second mechanical support member 24. Alternate embodiments of the present disclosure may use other mechanisms for coupling the driving AC signal to the MEMS vibrating structure 10, such as wire bonding. The driving AC signal may be sinusoidal or may be a periodic waveform of any shape. In alternate embodiments of the present disclosure, the MEMS vibrating structure 10 may be of any shape.

The first conducting layer 14 may be a metallization layer, which may include Chromium or other metal, and the second conducting layer 16 may be a metallization layer, which may include Chromium or other metal. The thickness of the single-crystal piezoelectric thin-film layer 12 in the MEMS vibrating structure 10 may be less than about ten micrometers. In a first exemplary embodiment of the present disclosure, the thickness of the single-crystal piezoelectric thin-film layer 12 in the MEMS vibrating structure 10 may be less than about one micro-meter.

The single-crystal piezoelectric thin film layer 12 in the MEMS vibrating structure 10 may include Lithium Tantalate, Lithium Niobate, Quartz, Langasite, Langanate, Langatate, Potassium Niobate, or any combination thereof. The substrate 28 may include Lithium Tantalate, Lithium Niobate, Quartz, Silicon, Gallium Arsenide, Langasite, Langanate, Langatate, Potassium Niobate, or any combination thereof. A motional impedance presented between the first and second conducting layers 14, 16 may be less than about 100 ohms at a first frequency. In an exemplary embodiment of the present disclosure, the motional impedance presented between the first and second conducting layers 14, 16 may be less than about 50 ohms at a first frequency.

Figure 7A:
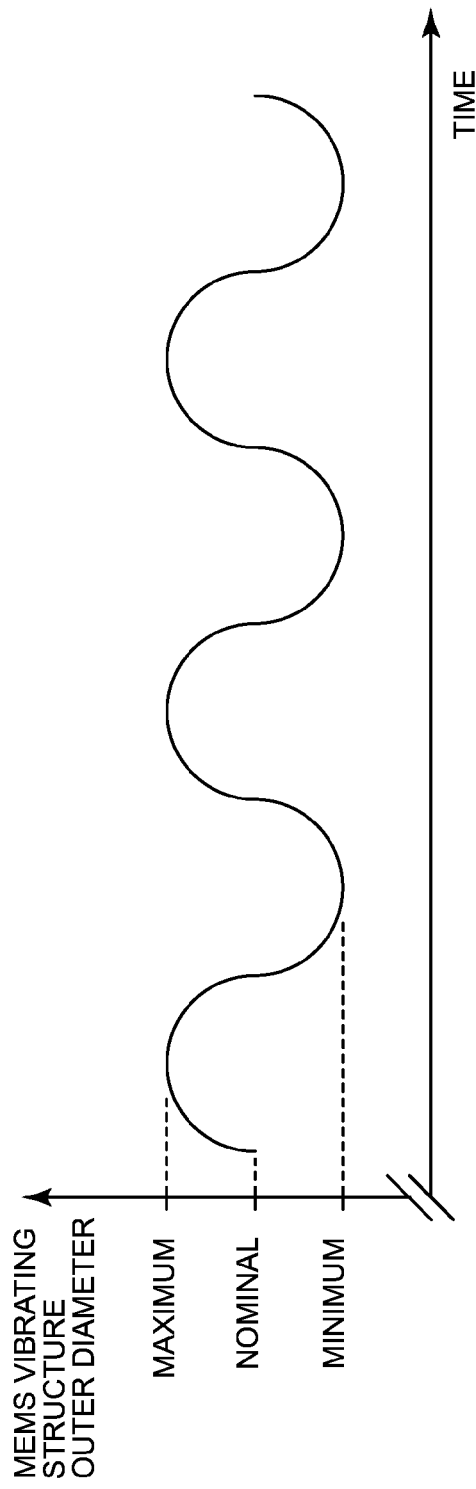

FIG. 7A is a graph illustrating how the outer diameter 30 of the MEMS vibrating structure 10, which is illustrated in FIG. 1, varies with time. Since the MEMS vibrating structure 10 is in the shape of a disk, the dominant vibrations may be contour mode vibrations and may manifest themselves primarily as changing the outer diameter 30 of the disk over time from a nominal value to a maximum value, back to the nominal value, to a minimum value, back to the nominal value, and so on.

Figure 7B:
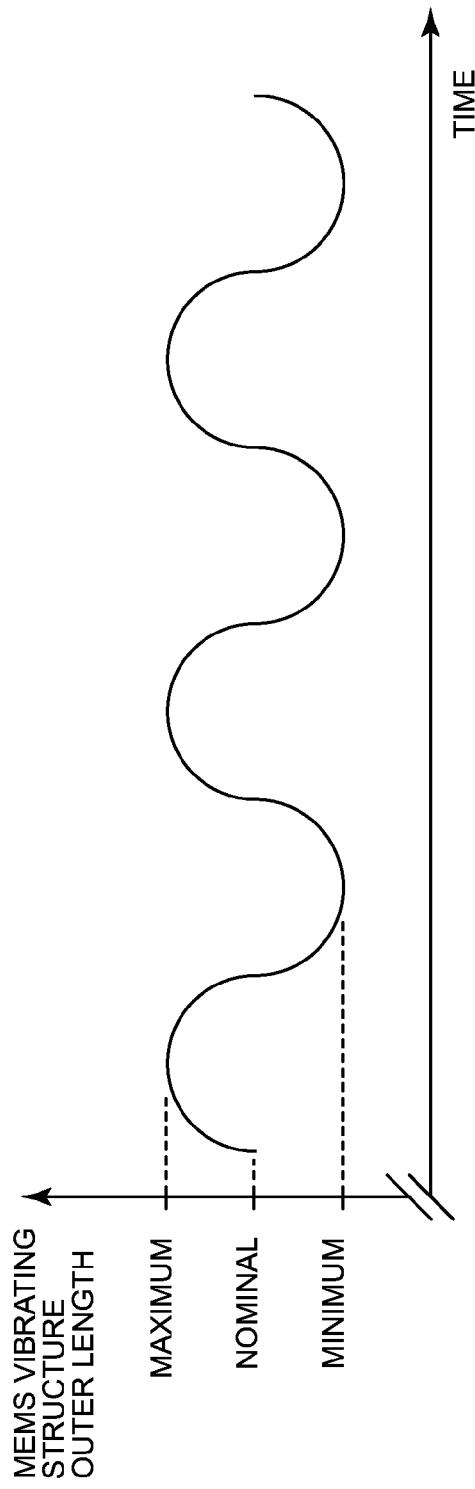

FIG. 7B is a graph illustrating how the outer length 40 of the MEMS vibrating structure 10, which is illustrated in FIG. 4, varies with time. Since the MEMS vibrating structure 10 is in the shape of a square, the vibrations may be length-extensional mode vibrations and may manifest themselves primarily as changing the outer length 40 of the square over time from a nominal value to a maximum value, back to the nominal value, to a minimum value, back to the nominal value, and so on. The outer length 40 of the MEMS vibrating structure 10 illustrated in FIG. 6 may vary in a similar manner.

Figure 7C:
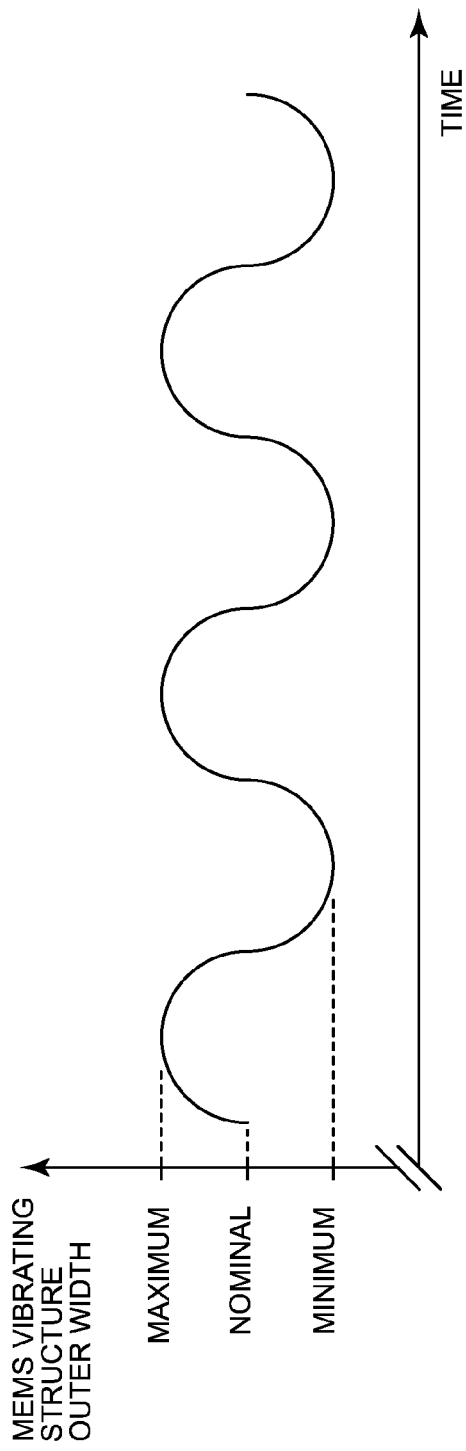

FIG. 7C is a graph illustrating how the outer width 42 of the MEMS vibrating structure 10, which is illustrated in FIG. 4, varies with time. Since the MEMS vibrating structure 10 is in the shape of a square, the dominant vibrations may be width-extensional mode vibrations and may manifest themselves primarily as changing the outer width 42 of the square over time from a nominal value to a maximum value, back to the nominal value, to a minimum value, back to the nominal value, and so on. The outer width 42 of the MEMS vibrating structure 10 illustrated in FIG. 6 may vary in a similar manner.

Figure 7D:
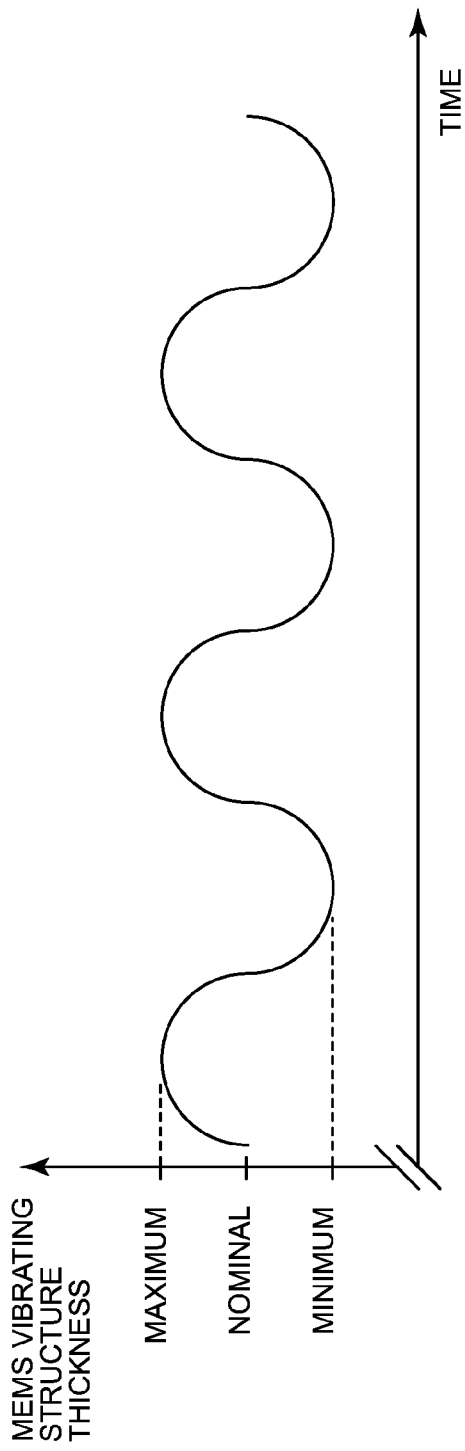

FIG. 7D is a graph illustrating how the thickness 32 of the MEMS vibrating structure 10, which is illustrated in FIG. 1, varies with time. The dominant vibrations may be thickness-extensional mode vibrations and may manifest themselves primarily as changing the thickness 32 of the MEMS vibrating structure 10 over time from a nominal value to a maximum value, back to the nominal value, to a minimum value, back to the nominal value, and so on. The thicknesses 32 of the MEMS vibrating structures 10 illustrated in FIGS. 4 and 6 may vary in a similar manner.

FIGS. 7E and 7F are graphs illustrating how the outer length 40 and the outer width 42 of the MEMS vibrating structure 10, which is illustrated in FIG. 4, vary with time, respectively. Since the MEMS vibrating structure 10 is in the shape of a square, the vibrations may be contour mode vibrations and may manifest themselves primarily as changing the outer length 40 and the outer width 42 simultaneously over time from nominal values to maximum values, back to the nominal values, to minimum values, back to the nominal values, and so on.

FIG. 8 shows a three-dimensional view of an inter-digital-transducer (IDT) MEMS vibrating structure according to one embodiment of the present disclosure. According to this embodiment, the second conducting layer 16 provides a first conducting section 48 on part of the first anchor 18, on the first mechanical support member 20, and on part of the MEMS vibrating structure 10. The second conducting layer 16 also provides a second conducting section 50 on the second anchor 22, on the second mechanical support member 24, and on part of the MEMS vibrating structure 10. On the first anchor 18, the second conducting layer 16 and the single-crystal piezoelectric thin-film layer 12 may be etched away to provide an electrical connection to the first conducting layer 14. The first conducting layer 14, the first conducting section 48, and the second conducting section 50 may be electrically isolated from one another. A MEMS vibrating structure 10 having multiple segments may be called an inter-digital transducer.

According to one embodiment, the dominant mode of vibration of the IDT MEMS device is a longitudinal mode of vibration, wherein the thickness 32 of the MEMS vibrating structure 10 varies in a wave-like motion as the structure vibrates. According to an additional embodiment, the dominant mode of vibration of the IDT MEMS device is a shear-horizontal mode of vibration.

FIG. 9 shows a three-dimensional view of an IDT MEMS vibrating structure according to an additional embodiment of the present disclosure. According to this embodiment, the first conducting layer 14 illustrated in FIG. 8 is not provided, and the surface of the single-crystal piezoelectric thin-film layer 12 facing the substrate 28 is left exposed. Only the second conducting layer 16 is provided. The second conducting layer 16 provides a first conducting section 48 on part of the first anchor 18, on the first mechanical support member 20, and on part of the MEMS vibrating structure 10. The second conducting layer 16 also provides a second conducting section 50 on the second anchor 22, on the second mechanical support member 24, and on part of the MEMS vibrating structure 10. The first conducting section 48 and the second conducting section 50 may be electrically isolated from one another. By providing only the second conducting layer 16, coupling between the single-crystal piezoelectric thin-film layer 12 and the second conducting layer 16 may be improved, thereby enhancing the performance of the MEMS vibrating structure 10.

According to one embodiment, the dominant mode of vibration of the IDT MEMS device is a longitudinal mode of vibration, wherein the thickness 32 of the MEMS vibrating structure 10 varies in a wave-like motion as the structure vibrates. According to an additional embodiment, the dominant mode of vibration of the IDT MEMS device is a shear-horizontal mode of vibration.

FIG. 10 shows a three-dimensional view of an IDT MEMS vibrating structure according to an additional embodiment of the present disclosure. According to this embodiment, the first conducting layer 14 includes a first conducting section 52 and a second conducting section 54. The first conducting section 52 of the first conducting layer 14 is located between the insulating layer 26 and the single-crystal piezoelectric thin-film layer 12 on the first anchor 18, on the surface of the first mechanical support member 20 facing the substrate 28, and on part of the surface of the MEMS vibrating structure 10 facing the substrate 28. The second conducting section 54 of the first conductive layer 14 is located between the insulating layer 26 and the single-crystal piezoelectric thin-film layer 12 on the second anchor 22, on the surface of the second mechanical support member 24 facing the substrate 28, and on part of the surface of the MEMS vibrating structure 10 facing the substrate 28.

The second conducting layer 16 also includes a first conducting section 48 and a second conducting section 50. The first conducting section 48 of the second conducting layer 16 is located on top of the single-crystal piezoelectric thin-film layer 12 on the first anchor 18, on top of the single-crystal piezoelectric thin-film layer 12 on the first mechanical support member 20, and on part of the surface of the MEMS vibrating structure 10 facing away from the substrate 28. The second conducting section 50 of the second conducting layer 16 is located on top of the single-crystal piezoelectric thin-film layer 12 on the second anchor 22, on top of the single-crystal piezoelectric thin-film layer 12 on the second mechanical support member 24, and on part of the surface of the MEMS vibrating structure 10 facing away from the substrate 28.

According to one embodiment, the dominant mode of vibration of the IDT MEMS device is a longitudinal mode of vibration, wherein the thickness 32 of the MEMS vibrating structure 10 varies in a wave-like motion as the structure vibrates. According to an additional embodiment, the dominant mode of vibration of the IDT MEMS device is a shear-horizontal mode of vibration.

FIG. 11A shows a top view of the MEMS vibrating structure 10 illustrated in FIGS. 8-10. The first and second conducting sections 48 and 50 of the second conducting layer 16 segment the surface of the MEMS vibrating structure 10 facing away from the substrate 28 into a first segment 56, a second segment 58, and a third segment 60. Each of the first, second, and third segments 56, 58, and 60 is rectangular in shape with the first conducting section 48 providing a first conducting finger 62 down the center of the first segment 56 and a second conducting finger 64 down the center of the second segment 58, and the second conducting section 50 providing a third conducting finger 66 down the center of the third segment 60. Normally, a first AC voltage is applied to the first conducting section 48, and a second AC voltage, which is phase-shifted about 180 degrees from the first AC voltage, is applied to the second conducting section 50. Therefore, the voltages surrounding the first and second segments 56 and 58 are phase-shifted about 180 degrees from the voltage surrounding the third segment 60, which drives the first and second segments 56 and 58 in directions that are opposite to the direction of the third segment 60.

For example, when the first and second segments 56, 58 are being driven to minimize the widths of the first and second segments 56, 58, the third segment 60 is being driven to maximize the width of the third segment 60, as illustrated in FIGS. 12A, 12B, and 12C. By sub-dividing the surface of the MEMS vibrating structure 10 into segments, each segment may vibrate at a higher frequency than an un-segmented MEMS vibrating structure 10. The higher frequencies may be better suited for certain RF applications. Alternate embodiments of the present disclosure may use any number of segments of any shape. The first and second AC voltages may be sinusoidal or may be periodic waveforms of any shape. In one embodiment of the present disclosure, the dominant mode of vibration is an IDT mode of vibration, which is one form of lateral vibration, wherein the widths of the first, second, and third segments 56, 58, and 60 vary as the MEMS vibrating structure 10 vibrate.

FIG. 11B shows a bottom view of the MEMS vibrating structure 10 shown in FIG. 10. The first and second conducting sections 52 and 54 of the first conducting layer 14 segment the surface of the MEMS vibrating structure 10 facing towards the substrate 28 into a first segment 68, a second segment 70, and a third segment 72. Each of the first, second, and third segments 68, 70, and 72 is rectangular in shape with the first conducting section 52 providing a first conducting finger 74 down the center of the first segment 68 and a second conducting finger 76 down the center of the second segment 70, and the second conducting section 54 providing a third conducting finger 78 down the center of the third segment 72. Normally, a first AC voltage is applied to the first conducting section 52, and a second AC voltage is applied to the second conducting section 54. Therefore, the voltages surrounding the first and second segments 68 and 70 are phase-shifted about 180 degrees from the voltage surrounding the third segment 72, which drives the first and second segments 68 and 70 in directions that are opposite to the direction of the third segment 72.

The first conducting section 52 and the second conducting section 54 of the first conducting layer 14 may behave substantially similar to the first conducting section 48 and the second conducting section 50 of the second conducting layer 16, as described above.

In certain applications, a first AC voltage is applied to the first conducting section 52 of the first conducting layer 14 and the first conducting section 48 of the second conducting layer 16. In such an application, a second AC voltage is applied to the second conducting section 54 of the first conducting layer 14 and the second conducting section 50 of the second conducting layer 16 that is phase-shifted about 180 degrees from the first AC voltage. Accordingly, the polarity of the voltage applied to each section of the MEMS vibrating device 10 on both the surface facing the substrate 28 and the surface facing away from the substrate 28 will be equal.

In alternative applications, a first AC voltage is applied to the first conducting section 52 of the first conducting layer 14, and a second AC voltage that is about 180 degrees out of phase with the first AC voltage is applied to the first conducting section 48 of the second conducting layer 16. In such an application, the first AC voltage is applied to the second conducting section 50 of the second conducting layer 16, and the second AC voltage is applied to the second conducting section 54 of the first conducting layer 14. Accordingly, the polarity of the voltage applied to each section of the MEMS vibrating device 10 is opposite on the surface facing the substrate 28 than that of the surface facing away from the substrate 28.

An alternative to the IDT MEMS vibrating structures 10 illustrated in FIGS. 8-10 is a periodically-poled-transducer (PPT) vibrating structure, according to an alternate embodiment of the present disclosure. Whereas the IDT MEMS vibrating structure 10 illustrated in FIG. 9 uses the first, second, and third conducting fingers 62, 64, 66 to drive the first, second, and third segments 56, 58, 60, respectively, at higher frequencies than an un-segmented MEMS vibrating structure 10, a PPT MEMS vibrating structure 10, where the single-crystal piezoelectric thin-film layer 12 is periodically poled instead of single domain poled, may use lumped top and bottom electrodes, which may be similar to the MEMS vibrating structure 10 illustrated in FIG. 4. The lumped top and bottom electrodes may be periodically driven and sensed to achieve high-order bulk modes, such as plate waves, which may provide high operating frequencies similar to the IDT MEMS vibrating structure 10. However, the PPT MEMS vibrating structure 10 may provide a higher transduction area, a lower electrode resistance, and higher power handling capability than a similar IDT MEMS vibrating structure 10. In one embodiment of the present disclosure, the dominant mode of vibration is a PPT mode of vibration, which is one form of lateral vibration, wherein plate waves are distributed across the MEMS vibrating structure 10.

The MEMS vibrating structures 10 illustrated in FIGS. 1, 3, 4, 5, 6, and 9 are examples of single-port resonators. The MEMS vibrating structures 10 illustrated in FIGS. 8 and 10 are examples of a dual-port IDT or dual-port resonator. In alternate embodiments of the present disclosure, the MEMS vibrating structure 10 may be of any shape, may be a single-port resonator, may be a dual-port resonator, or any combination thereof. The MEMS vibrating structures 10 illustrated in FIGS. 1, 3, 4, 5, and 6 are shown with the single-crystal piezoelectric thin-film layer 12 sandwiched between the first conducting layer 14 and the second conducting layer 16. The single-crystal piezoelectric thin-film layer 12 provides a body of the MEMS vibrating structure 10. In alternate embodiments of the present disclosure, the body of the MEMS vibrating structure 10 may include the single-crystal piezoelectric thin-film layer 12 and one or more additional layers of any material in any arrangement.

Figure 13A:
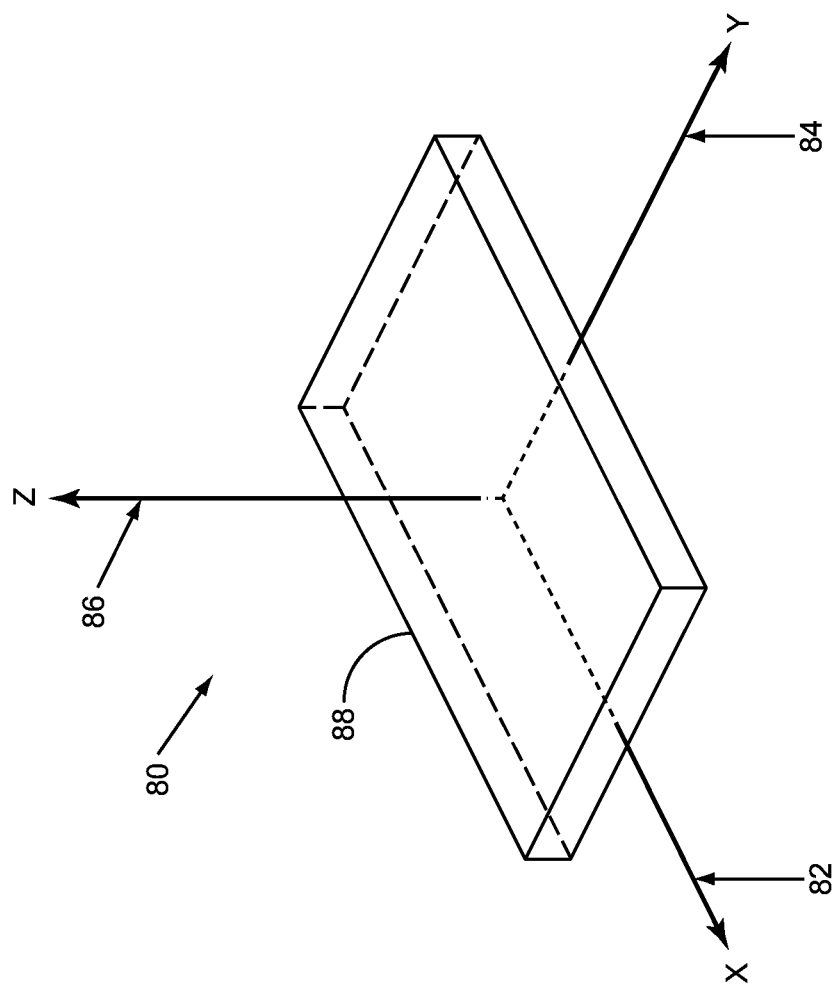

FIGS. 13A, 13B, 13C, 13D, 13E, and 13F show Cartesian Coordinate Systems for illustrating orientations of the uniform crystalline structure of the single-crystal piezoelectric thin-film layer 12 relative to the MEMS vibrating structures 10 illustrated in FIGS. 1, 3, 4, 5, 6, 8, 9, and 10. FIG. 13A shows a Cartesian Coordinate System 80 having an X-axis (X) 82, a Y-axis (Y) 84, and a Z-axis (Z) 86, all three of which are about perpendicular to one another. Additionally, FIG. 13A illustrates a crystalline structure 88 of the single-crystal piezoelectric thin-film layer 12 that is aligned with the Cartesian Coordinate System 80. The crystalline structure 88 may be provided from a z-cut wafer or from a z-oriented boule, which is a single-crystal ingot.

Figure 13B:
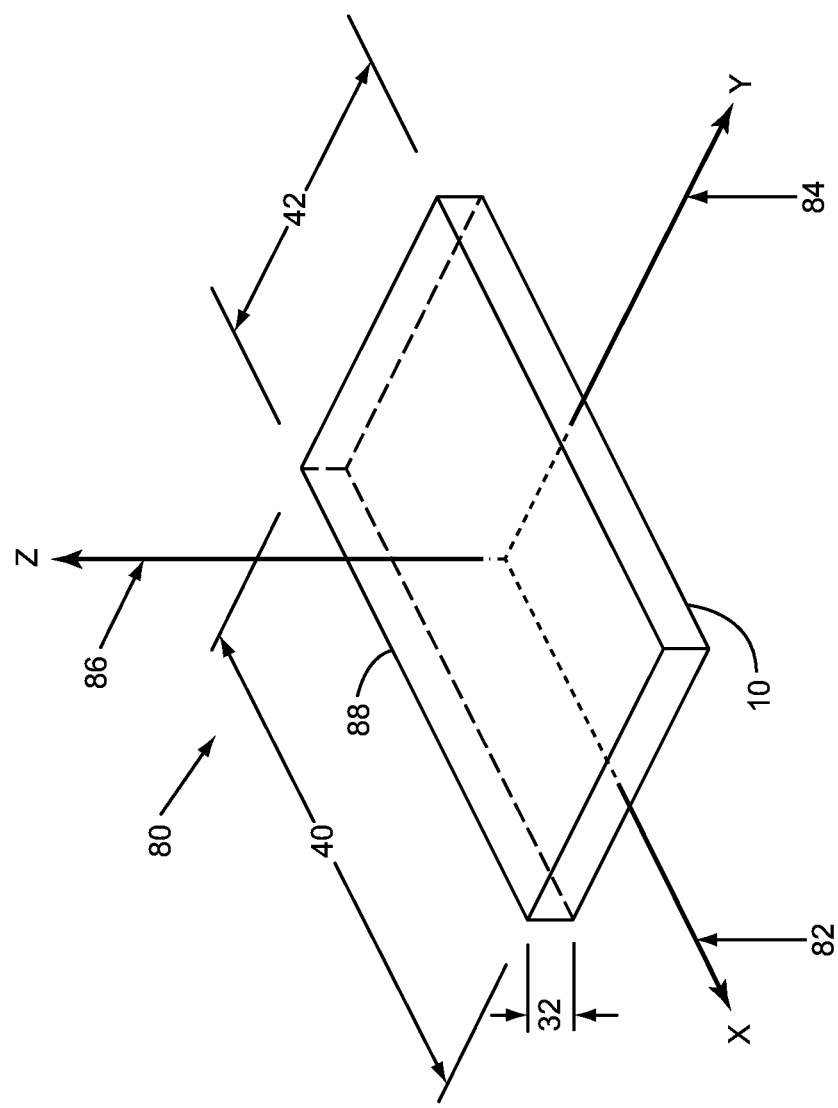

FIG. 13B shows the Cartesian Coordinate System 80 illustrated in FIG. 13A having the rectangular-shaped MEMS vibrating structure 10 (FIG. 6) aligned with the Cartesian Coordinate System 80. The rectangular-shaped MEMS vibrating structure 10 includes the outer length 40, which is about parallel with the X-axis (X) 82, the outer width 42, which is about parallel with the Y-axis (Y) 84, and the thickness 32, which is about parallel with the Z-axis (Z) 86.

The crystalline structure 88 of the single-crystal piezoelectric thin-film layer 12 will remain aligned with the Cartesian Coordinate System 80. However, the Cartesian Coordinate System 80 will be translated to create translated Cartesian Coordinate Systems, which will be aligned with the MEMS vibrating structure 10, as illustrated in FIGS. 1, 3, 4, 5, 6, 8, 9, and 10. Therefore, the orientation of the uniform crystalline structure of the single-crystal piezoelectric thin-film layer 12 relative to the MEMS vibrating structures 10 illustrated in FIGS. 1, 3, 4, 5, 6, 8, 9, and 10 may be characterized by the translations between the Cartesian Coordinate System 80 and the translated Cartesian Coordinate Systems. Euler angles will be used to characterize the translations between the Cartesian Coordinate System 80 and the translated Cartesian Coordinate Systems. Since the disk-shaped and circular-ring shaped MEMS vibrating structures 10 (FIGS. 1 and 3) do not have the discernable outer lengths 40 and the outer widths 42, alignments in the plane of the X-axis (X) 82 and the Y-axis (Y) 84 for these MEMS vibrating structures 10 are arbitrary.

Figure 13C:
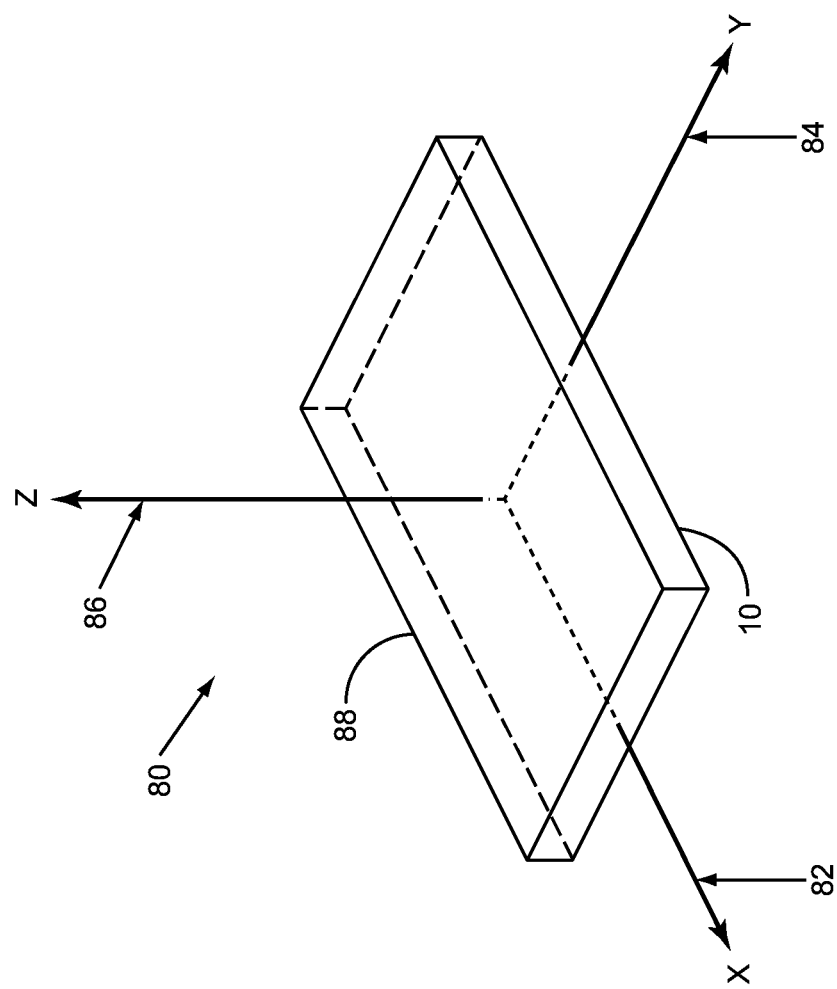

FIG. 13C shows the Cartesian Coordinate System 80 coincident with the crystalline structure 88, which is coincident with the rectangular-shaped MEMS vibrating structure 10. Therefore, before translating the Cartesian Coordinate System 80, the crystalline structure 88 of the single-crystal piezoelectric thin-film layer 12 is aligned with the MEMS vibrating structure 10. Historically, Euler angles have been used to characterize three-dimensional orientations of one structure relative to another structure.

Figure 13D:
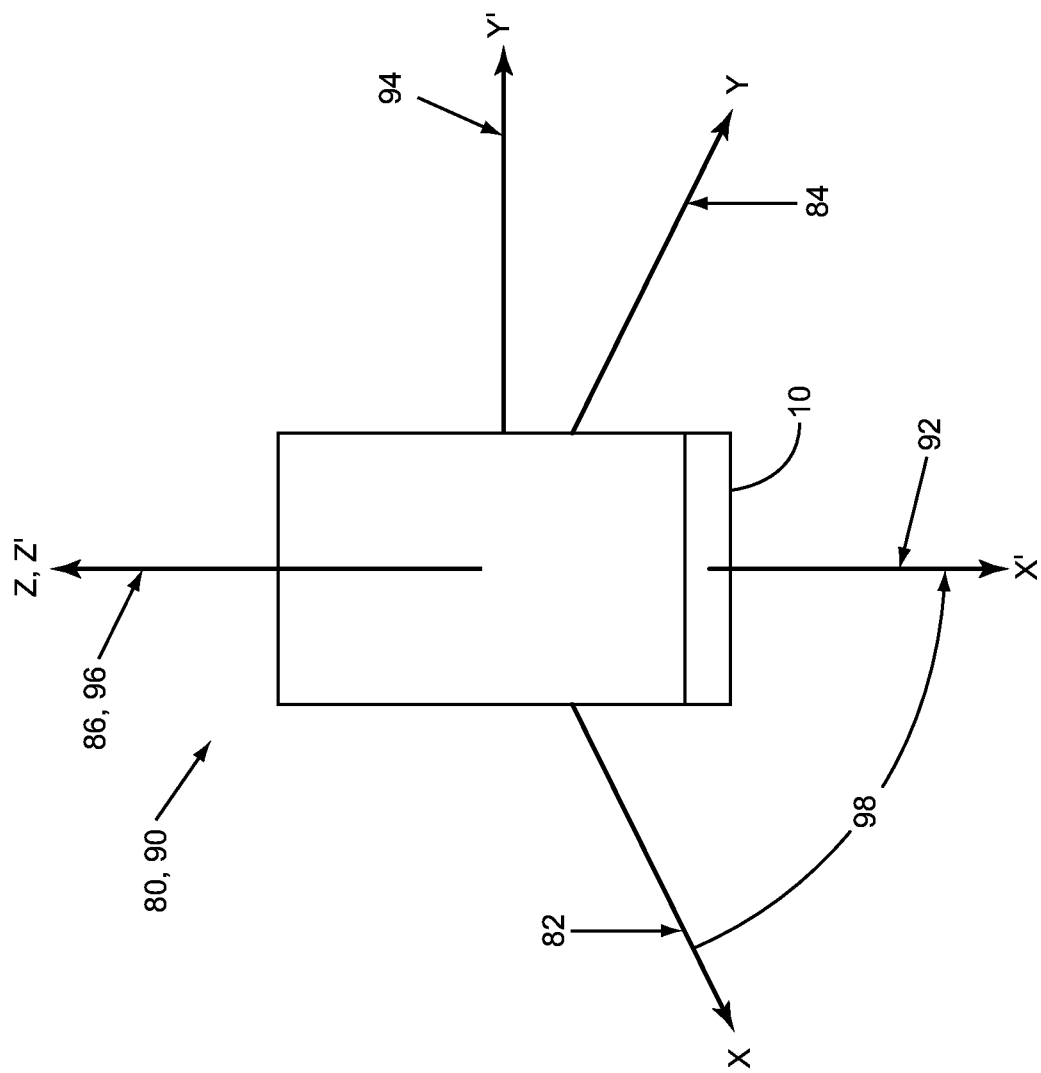

FIG. 13D shows the Cartesian Coordinate System 80 and a first translated Cartesian Coordinate System 90, which is obtained by keeping the Z-axis (Z) 86 stationary and rotating the X-axis (X) 82 toward the Y-axis (Y) 84 to form a first translated X-axis (X'), a first translated Y-axis (Y'), and a first translated Z-axis (Z') 92, 94, 96, which are all perpendicular to one another. A first Euler angle 98 is the angle formed between the X-axis (X) 82 and the first translated X-axis (X') 92. The first translated Z-axis (Z') 96 is coincident with the Z-axis (Z) 86.

Figure 13E:
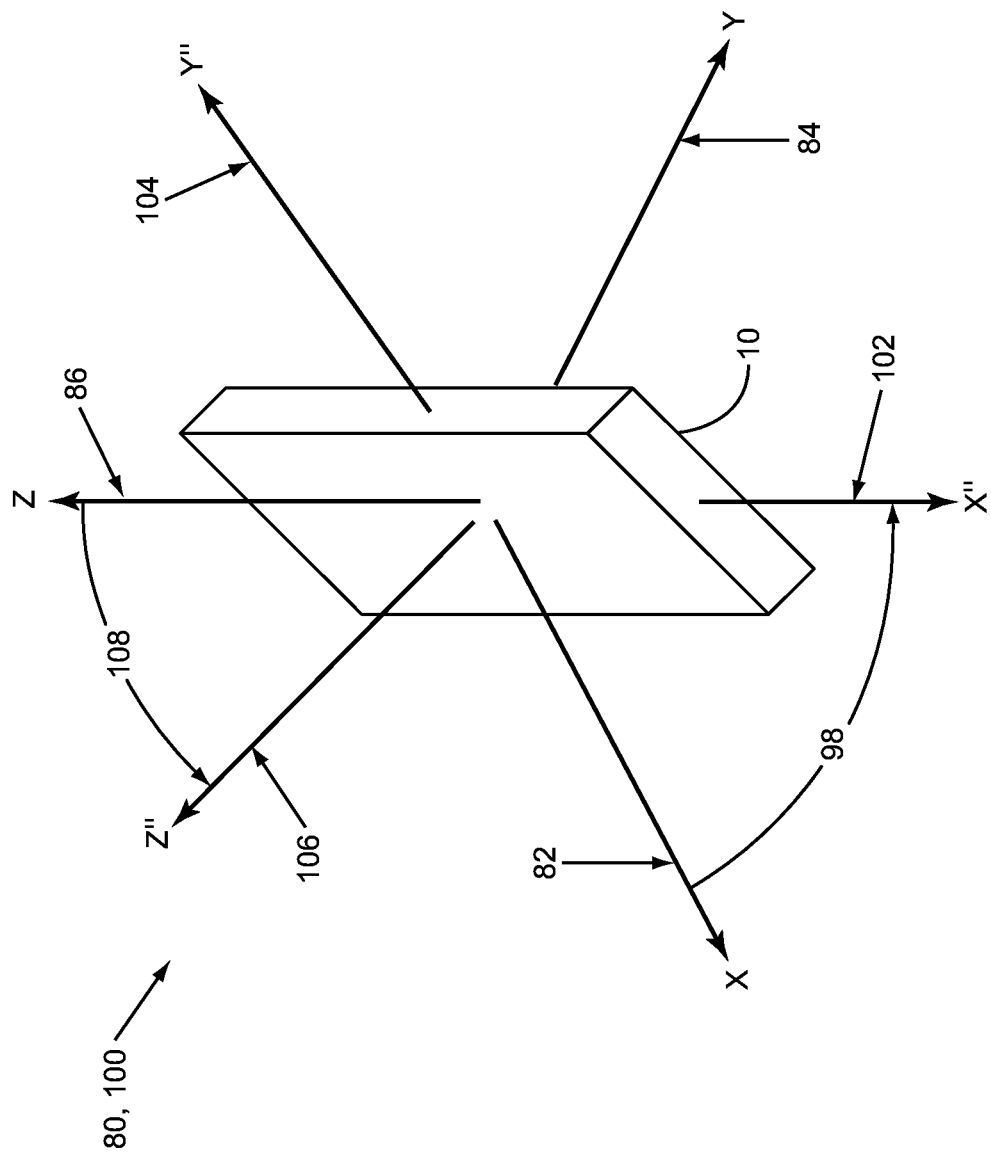

FIG. 13E shows the Cartesian Coordinate System 80 and a second translated Cartesian Coordinate System 100, which is obtained by keeping the first translated X-axis (X') 92 stationary and rotating the first translated Z-axis (Z') 96 away from the first translated Y-axis (Y') 94 to form a second translated X-axis (X"), a second translated Y-axis (Y"), and a second translated Z-axis (Z") 102, 104, 106, which are all perpendicular to one another. A second Euler angle 108, which is achieved after obtaining the first Euler angle 98, is the angle formed between the Z-axis (Z) 86 and the second translated Z-axis (Z") 106. Since the first translated Z-axis (Z') 96 is coincident with the Z-axis (Z) 86, the second Euler angle 108 is equal to the angle formed between the first translated Z-axis (Z') 96 and the second translated Z-axis (Z") 106. The first translated X-axis (X') 92 is coincident with the second translated X-axis (X") 102.

Figure 13F:
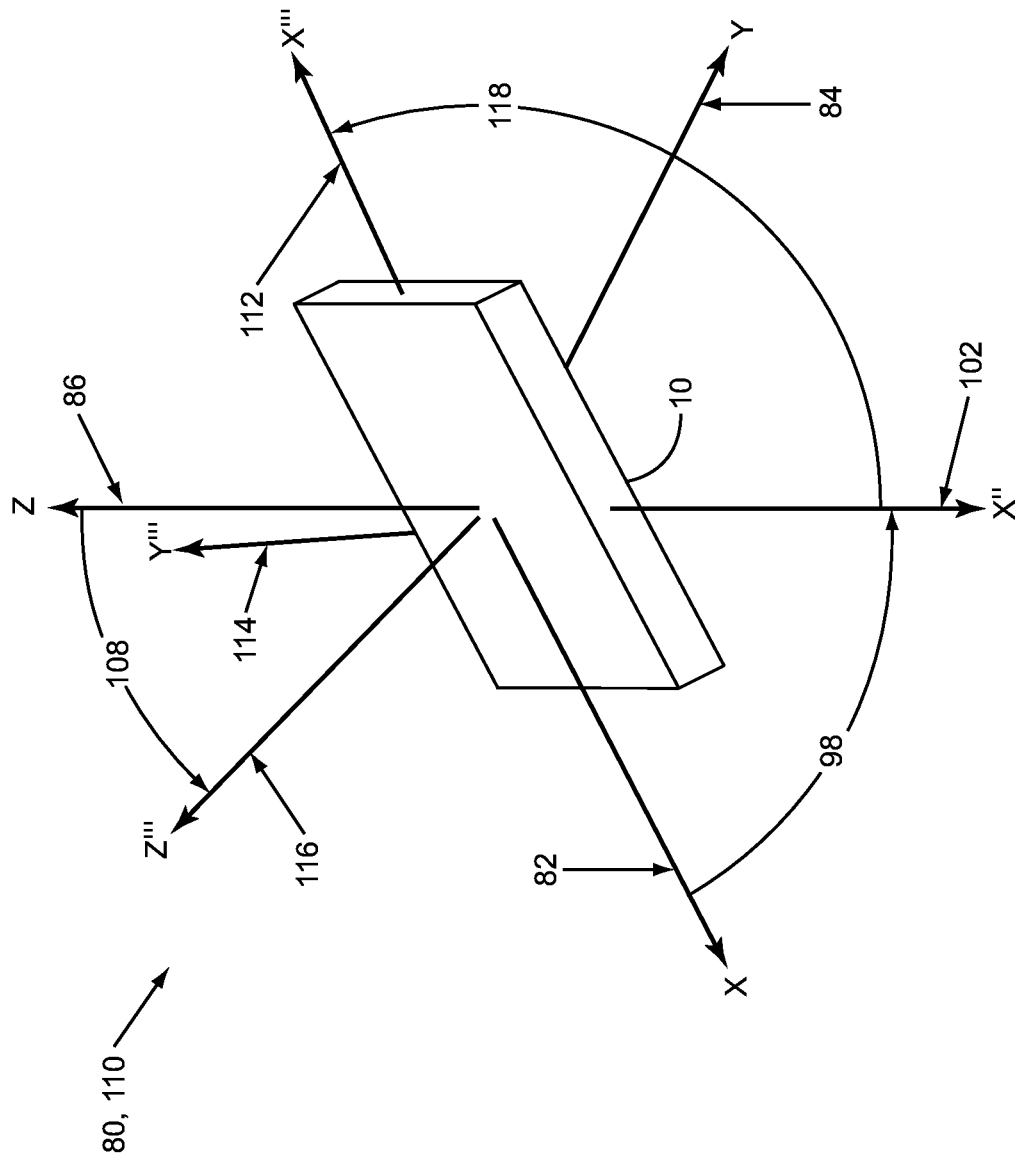

FIG. 13F shows the Cartesian Coordinate System 80 and a third translated Cartesian Coordinate System 110, which is obtained by keeping the second translated Z-axis (Z") 106 stationary and rotating the second translated X-axis (X") 102 toward the second translated Y-axis (Y") 104 to form a third translated X-axis (X'''), a third translated Y-axis (Y'''), and a third translated Z-axis (Z''') 112, 114, 116, which are all perpendicular to one another. A third Euler angle 118, which is achieved after obtaining the second Euler angle 108, is the angle formed between the second translated X-axis (X") 102 and the third translated X-axis (X''') 112. Since the first translated X-axis (X') 92 is coincident with the second translated X-axis (X") 102, the third Euler angle 118 is equal to the angle formed between the first translated X-axis (X') 92 and the third translated X-axis (X''') 112. The second translated Z-axis (Z") 106 is coincident with third translated Z-axis (Z''') 116. The first Euler angle 98 is called Phi ($\phi$), the second Euler angle 108 is called Theta ($\theta$), and the third Euler angle 118 is called Psi ($\psi$).

The Euler angles chosen for a particular single-crystal piezoelectric thin-film layer 12 determine the performance characteristics of a given MEMS vibrating structure 10. For a MEMS vibrating structure 10 operating in a longitudinal mode of vibration, Euler angles about the range of values specified by Equation (1) will yield an electric potential within 20% of the maximum achievable value.

$$|[\sin(\varphi + n*120°)\cos\psi + \cos(\varphi + n*120°)\cos\theta\sin\psi]\cos(38°) + \sin\theta\sin\psi\sin(38°)| \geq \cos\alpha \quad (1)$$

where n=−1, 0, 1, (φ, θ, ψ) represent a first Euler angle, a second Euler angle, and a third Euler angle, respectively, and α=27°. Using any combination of Euler angles that satisfy Equation (1) to define the crystalline orientation of the single-crystal piezoelectric thin-film layer 12 will yield desirable performance characteristics for a MEMS vibrating structure 10 operating in a longitudinal mode of vibration. For example, choosing a set of Euler angles to satisfy Equation (1) while operating the MEMS vibrating structure 10 in a longitudinal mode of vibration may yield a minimized temperature coefficient, a maximized electromechanical coupling coefficient, maximum bandwidth, or any combination thereof.

According to one exemplary embodiment, the piezoelectric body of the IDT MEMS vibrating structure shown in FIG. 9 may comprise lithium niobate. Further, the IDT MEMS vibrating structure shown in FIG. 9 may predominantly vibrate in a longitudinal mode of operation. In such an embodiment, the first Euler angle (φ) may be between about −10° and 10°, the second Euler angle (θ) may be between about 30° and 60°, and the third Euler angle (ψ) may be between about 80° and 100°. According to an additional embodiment, the first Euler angle (φ) may be between about 170° and 190°, the second Euler angle (θ) may be between about 120° and 150°, and the third Euler angle (ψ) may be between about 80° and 100°. According to an additional embodiment, the first Euler angle (φ) may be between about −10° and 10°, the second Euler angle (θ) may be between about 30° and 60°, and the third Euler angle (ψ) may be between about 260° and 280°. According to an additional embodiment, the first Euler angle (φ) may be between about 170° and 190°, the second Euler angle (θ) may be between about 120° and 150°, and the third Euler angle (ψ) may be between about 260° and 280°. According to an additional embodiment, the first Euler angle (φ) may be between about 110° and 130°, the second Euler angle (θ) may be between about 30° and 60°, and the third Euler angle (ψ) may be between about 80° and 100°. According to an additional embodiment, the first Euler angle (φ) may be between about 290° and 310°, the second Euler angle (θ) may be between about 120° and 150°, and the third Euler angle (ψ) may be between about 80° and 100°. According to an additional embodiment, the first Euler angle (φ) may be between about 110° and 130°, the second Euler angle (θ) may be between about 30° and 60°, and the third Euler angle (ψ) may be between about 260° and 280°. According to an additional embodiment, the first Euler angle (φ) may be between about 290° and 310°, the second Euler angle (θ) may be between about 120° and 150°, and the third Euler angle (ψ) may be between about 260° and 280°. According to an additional embodiment, the first Euler angle (φ) may be between about 230° and 250°, the second Euler angle (θ) may be between about 30° and 60°, and the third Euler angle (ψ) may be between about 80° and 100°. According to an additional embodiment, the first Euler angle (φ) may be between about 50° and 70°, the second Euler angle (θ) may be between about 120° and 150°, and the third Euler angle (ψ) may be between about 80° and 100°. According to an additional embodiment, the first Euler angle (φ) may be between about 230° and 250°, the second Euler angle (θ) may be between about 30° and 60°, and the third Euler angle (ψ) may be between about 260° and 280°. According to an additional embodiment, the first Euler angle (φ) may be between about 50° and 70°, the second Euler angle (θ) may be between about 120° and 150°, and the third Euler angle (ψ) may be between about 260° and 280°.

As an additional exemplary embodiment, the piezoelectric body of the IDT MEMS vibrating structure shown in FIG. 10 may comprise lithium niobate. Further, the IDT MEMS vibrating structure shown in FIG. 10 may predominantly vibrate in a longitudinal mode of operation. In such an embodiment, the first Euler angle (φ) may be between about −10° and 10°, the second Euler angle (θ) may be between about 30° and 60°, and the third Euler angle (ψ) may be between about 80° and 100°. According to an additional embodiment, the first Euler angle (φ) may be between about 170° and 190°, the second Euler angle (θ) may be between about 120° and 150°, and the third Euler angle (ψ) may be between about 80° and 100°. According to an additional embodiment, the first Euler angle (φ) may be between about −10° and 10°, the second Euler angle (θ) may be between about 30° and 60°, and the third Euler angle (ψ) may be between about 260° and 280°. According to an additional embodiment, the first Euler angle (φ) may be between about 170° and 190°, the second Euler angle (θ) may be between about 120° and 150°, and the third Euler angle (ψ) may be between about 260° and 280°. According to an additional embodiment, the first Euler angle (φ) may be between about 110° and 130°, the second Euler angle (θ) may be between about 30° and 60°, and the third Euler angle (ψ) may be between about 80° and 100°. According to an additional embodiment, the first Euler angle (φ) may be between about 290° and 310°, the second Euler angle (θ) may be between about 120° and 150°, and the third Euler angle (ψ) may be between about 80° and 100°. According to an additional embodiment, the first Euler angle (φ) may be between about 110° and 130°, the second Euler angle (θ) may be between about 30° and 60°, and the third Euler angle (ψ) may be between about 260° and 280°. According to an additional embodiment, the first Euler angle (φ) may be between about 290° and 310°, the second Euler angle (θ) may be between about 120° and 150°, and the third Euler angle (ψ) may be between about 260° and 280°. According to an additional embodiment, the first Euler angle (φ) may be between about 230° and 250°, the second Euler angle (θ) may be between about 30° and 60°, and the third Euler angle (ψ) may be between about 80° and 100°. According to an additional embodiment, the first Euler angle (φ) may be between about 50° and 70°, the second Euler angle (θ) may be between about 120° and 150°, and the third Euler angle (ψ) may be between about 80° and 100°. According to an additional embodiment, the first Euler angle (φ) may be between about 230° and 250°, the second Euler angle (θ) may be between about 30° and 60°, and the third Euler angle (ψ) may be between about 260° and 280°. According to an additional embodiment, the first Euler angle (φ) may be between about 50° and 70°, the second Euler angle (θ) may be between about 120° and 150°, and the third Euler angle (ψ) may be between about 260° and 280°.

For a MEMS vibrating structure 10 operating in a shear-horizontal mode of vibration, Euler angles about the range of values specified by Equations (2) and (3) will yield an electric potential within 20% of the maximum achievable value.

$$|\sin\theta \sin\psi| \leq \cos 45° \quad (2)$$

$$|\sin(\phi+n*120°)\sin\psi+\sqrt{3}\sin\theta\cos\psi-\cos(\phi+n*120°)\cos\theta\cos\psi| \geq 1 \quad (3)$$

where n=−1, 0, 1, and (φ, θ, ψ) represent a first Euler angle, a second Euler angle, and a third Euler angle, respectively. Using any combination of Euler angles that satisfy Equations (2) and (3) to define the crystalline orientation of the single-crystal piezoelectric thin-film layer 12 will yield desirable performance characteristics for a MEMS vibrating structure 10 operating in a shear-horizontal mode of vibration. For example, choosing a set of Euler angles to satisfy Equations (2) and (3) while operating the MEMS vibrating structure 10 in a shear-horizontal mode of vibration may yield a minimized temperature coefficient, a maximized electromechanical coupling coefficient, maximum bandwidth, or any combination thereof.

According to one exemplary embodiment, the piezoelectric body of the IDT MEMS vibrating structure shown in FIG. 9 may comprise lithium niobate. Further, the IDT MEMS vibrating structure shown in FIG. 9 may predominantly vibrate in a shear-horizontal mode of operation. In such an embodiment, the first Euler angle (φ) may be between about −10° and 10°, and the second Euler angle (θ) may be between about 100° and 141°. According to an additional embodiment, the first Euler angle (φ) may be between about 170° and 190°, and the second Euler angle (θ) may be between about 40° and 81°. According to an additional embodiment, the first Euler angle (φ) may be between about 110° and 130°, and the second Euler angle (θ) may be between about 100° and 141°. According to an additional embodiment, the first Euler angle (φ) may be between about 290° and 310°, and the second Euler angle (θ) may be between about 40° and 81°. According to an additional embodiment, the first Euler angle (φ) may be between about 230° and 250°, and the second Euler angle (θ) may be between about 100° and 141°. According to an additional embodiment, the first Euler angle (φ) may be between about 50° and 70°, and the second Euler angle (θ) may be between about 40° and 81°.

As an additional exemplary embodiment, the piezoelectric body of the IDT MEMS vibrating structure shown in FIG. 10 may comprise lithium niobate. Further, the IDT MEMS vibrating structure shown in FIG. 10 may predominantly vibrate in a shear-horizontal mode of operation. In such an embodiment, the first Euler angle (φ) may be between about −10° and 10°, and the second Euler angle (θ) may be between about 100° and 141°. According to an additional embodiment, the first Euler angle (φ) may be between about 170° and 190°, and the second Euler angle (θ) may be between about 40° and 81°. According to an additional embodiment, the first Euler angle (φ) may be between about 110° and 130°, and the second Euler angle (θ) may be between about 100° and 141°. According to an additional embodiment, the first Euler angle (φ) may be between about 290° and 310°, and the second Euler angle (θ) may be between about 40° and 81°. According to an additional embodiment, the first Euler angle (φ) may be between about 230° and 250°, and the second Euler angle (θ) may be between about 100° and 141°. According to an additional embodiment, the first Euler angle (φ) may be between about 50° and 70°, and the second Euler angle (θ) may be between about 40° and 81°.

An exemplary application of the MEMS vibrating structure 10 is its use as filtering circuitry in a mobile terminal 120, the basic architecture of which is represented in FIG. 14. The mobile terminal 120 may include a receiver front end 122, a radio frequency transmitter section 124, an antenna 126, a duplexer or switch 128, a baseband processor 130, a control system 132, a frequency synthesizer 134, and an interface 136. The receiver front end 122 receives information bearing radio frequency signals from one or more remote transmitters provided by a base station (not shown). A low noise amplifier (LNA) 138 amplifies the signal. Filtering circuitry 140, which may include one or more of the MEMS vibrating structures 10, minimizes broadband interference in the received signal, while down conversion and digitization circuitry 142 down converts the filtered, received signal to an intermediate or baseband frequency signal, which is then digitized into one or more digital streams. The receiver front end 122 typically uses one or more mixing frequencies generated by the frequency synthesizer 134. The baseband processor 130 processes the digitized received signal to extract the information or data bits conveyed in the received signal. This processing typically comprises demodulation, decoding, and error correction operations. As such, the baseband processor 130 is generally implemented in one or more digital signal processors (DSPs).

On the transmit side, the baseband processor 130 receives digitized data, which may represent voice, data, or control information, from the control system 132, which it encodes for transmission. The encoded data is output to the transmitter 124, where it is used by a modulator 144 to modulate a carrier signal that is at a desired transmit frequency. Power amplifier circuitry 146 amplifies the modulated carrier signal to a level appropriate for transmission, and delivers the amplified and modulated carrier signal to the antenna 126 through the duplexer or switch 128.

A user may interact with the mobile terminal 120 via the interface 136, which may include interface circuitry 148 associated with a microphone 150, a speaker 152, a keypad 154, and a display 156. The interface circuitry 148 typically includes analog-to-digital converters, digital-to-analog converters, amplifiers, and the like. Additionally, it may include a voice encoder/decoder, in which case it may communicate directly with the baseband processor 130. The microphone 150 will typically convert audio input, such as the user's voice, into an electrical signal, which is then digitized and passed directly or indirectly to the baseband processor 130. Audio information encoded in the received signal is recovered by the baseband processor 130, and converted by the interface circuitry 148 into an analog signal suitable for driving the speaker 152. The keypad 154 and the display 156 enable the user to interact with the mobile terminal 120, input numbers to be dialed, address book information, or the like, as well as monitor call progress information.

Those skilled in the art will recognize improvements and modifications to the preferred embodiments of the present disclosure. All such improvements and modifications are considered within the scope of the concepts disclosed herein and the claims that follow.

What is claimed is:

1. A micro-electrical-mechanical system (MEMS) vibrating structure adapted to predominantly vibrate in a longitudinal mode of vibration and comprising:
   a carrier substrate;
   a first anchor on a first surface of the carrier substrate;
   a second anchor on the first surface of the carrier substrate;
   a single-crystal piezoelectric body suspended between the first anchor and the second anchor and including a first surface parallel to and facing the carrier substrate and a second surface opposite the first surface, the single-crystal piezoelectric body including a uniform crystalline orientation defined by a first Euler angle (φ), a second Euler angle (θ), and a third Euler angle (ψ); and
   only one conductive layer on the second surface of the single-crystal piezoelectric body, the conductive layer comprising a first conductive section over the first anchor and a portion of the single-crystal piezoelectric body and a second conductive section over the second anchor and a portion of the single-crystal piezoelectric body.

2. The MEMS vibrating structure of claim 1 wherein the single-crystal piezoelectric body comprises lithium niobate.

3. The MEMS vibrating structure of claim 2 wherein the Euler angles satisfy the following equation:

$$|[\sin(\phi+n*120°)\cos\psi+\cos(\phi+n*120°)\cos\theta\sin\psi]\cos(38°)+\sin\theta\sin\psi\sin(38°)| \geq \cos\alpha$$

where n=−1, 0, 1, and α=27°.

4. The MEMS vibrating structure of claim 3 wherein the first Euler angle (φ) is between about −10° and 10°, the second Euler angle (θ) is between about 30° and 60°, and the third Euler angle (ψ) is between about 80° and 100°.

5. The MEMS vibrating structure of claim 3 wherein the first Euler angle (φ) is between about 170° and 190°, the second Euler angle (θ) is between about 120° and 150°, and the third Euler angle (ψ) is between about 80° and 100°.

6. The MEMS vibrating structure of claim 3 wherein the first Euler angle (φ) is between about −10° and 10°, the second Euler angle (θ) is between about 30° and 60°, and the third Euler angle (ψ) is between about 260° and 280°.

7. The MEMS vibrating structure of claim 3 wherein the first Euler angle (φ) is between about 170° and 190°, the second Euler angle (θ) is between about 120° and 150°, and the third Euler angle (ψ) is between about 260° and 280°.

8. The MEMS vibrating structure of claim 3 wherein the first Euler angle (φ) is between about 110° and 130°, the second Euler angle (θ) is between about 30° and 60°, and the third Euler angle (ψ) is between about 80° and 100°.

9. The MEMS vibrating structure of claim 3 wherein the first Euler angle (φ) is between about 290° and 310°, the second Euler angle (θ) is between about 120° and 150°, and the third Euler angle (ψ) is between about 80° and 100°.

10. The MEMS vibrating structure of claim 3 wherein the first Euler angle (φ) is between about 110° and 130°, the second Euler angle (θ) is between about 30° and 60°, and the third Euler angle (ψ) is between about 260° and 280°.

11. The MEMS vibrating structure of claim 3 wherein the first Euler angle (φ) is between about 290° and 310°, the second Euler angle (θ) is between about 120° and 150°, and the third Euler angle (ψ) is between about 260° and 280°.

12. The MEMS vibrating structure of claim 3 wherein the first Euler angle (φ) is between about 230° and 250°, the second Euler angle (θ) is between about 30° and 60°, and the third Euler angle (ψ) is between about 80° and 100°.

13. The MEMS vibrating structure of claim 3 wherein the first Euler angle (φ) is between about 50° and 70°, the second Euler angle (θ) is between about 120° and 150°, and the third Euler angle (ψ) is between about 80° and 100°.

14. The MEMS vibrating structure of claim 3 wherein the first Euler angle (φ) is between about 230° and 250°, the second Euler angle (θ) is between about 30° and 60°, and the third Euler angle (ψ) is between about 260° and 280°.

15. The MEMS vibrating structure of claim 3 wherein the first Euler angle (φ) is between about 50° and 70°, the second Euler angle (θ) is between about 120° and 150°, and the third Euler angle (ψ) is between about 260° and 280°.

16. The MEMS vibrating structure of claim 1 wherein the first conductive section and the second conductive section of the conductive layer are inter-digitally dispersed on the second surface of the piezoelectric body.

17. The MEMS vibrating structure of claim 1 wherein the first conductive section of the conductive layer is adapted to receive a first alternating current (AC) voltage, and the second conductive section of the conductive layer is adapted to receive a second AC voltage that is 180 degrees out of phase with the first AC voltage.

18. The MEMS vibrating structure of claim 1 wherein the MEMS vibrating structure is adapted for use as a radio frequency filter.

19. The MEMS vibrating structure of claim 1 wherein the single-crystal piezoelectric body comprises lithium tantalate.

20. A micro-electrical-mechanical system (MEMS) vibrating structure adapted to predominantly vibrate in a shear-horizontal mode of vibration and comprising:
   a carrier substrate;
   a first anchor on a first surface of the carrier substrate;
   a second anchor on the first surface of the carrier substrate;
   a single-crystal piezoelectric body suspended between the first anchor and the second anchor and including a first surface parallel to and facing the carrier substrate and a second surface opposite the first surface, the single-crystal piezoelectric body including a uniform crystalline orientation defined by a first Euler angle (φ), a second Euler angle (θ), and a third Euler angle (ψ); and
   only one conductive layer on the second surface of the single-crystal piezoelectric body, the conductive layer comprising a first conductive section over the first anchor and a portion of the single-crystal piezoelectric body and a second conductive section over the second anchor and a portion of the single-crystal piezoelectric body.

21. The MEMS vibrating structure of claim 20 wherein the single-crystal piezoelectric body comprises lithium niobate.

22. The MEMS vibrating structure of claim 21 wherein each one of the Euler angles satisfy the following equations:

$$|\sin\theta\sin\psi| \leq \cos 45°$$

$$|\sin(\phi+n*120°)\sin\psi+\sqrt{3}\sin\theta\cos\psi-\cos(\phi+n*120°)\cos\theta\cos\psi| \geq 1$$

where n=−1, 0, 1.

23. The MEMS vibrating structure of claim 22 wherein the first Euler angle (φ) is between about −10° and 10°, and the second Euler angle (θ) is between about 100° and 141°.

24. The MEMS vibrating structure of claim 22 wherein the first Euler angle (φ) is between about 170° and 190°, and the second Euler angle (θ) is between about 40° and 81°.

25. The MEMS vibrating structure of claim 22 wherein the first Euler angle (φ) is between about 110° and 130°, and the second Euler angle (θ) is between about 100° and 141°.

26. The MEMS vibrating structure of claim 22 wherein the first Euler angle (φ) is between about 290° and 310°, and the second Euler angle (θ) is between about 40° and 81°.

27. The MEMS vibrating structure of claim 22 wherein the first Euler angle (φ) is between about 230° and 250°, and the second Euler angle (θ) is between about 100° and 141°.

28. The MEMS vibrating structure of claim 22 wherein the first Euler angle (φ) is between about 50° and 70°, and the second Euler angle (θ) is between about 40° and 81°.

29. The MEMS vibrating structure of claim 20 wherein the first conductive section and the second conductive section of the conductive layer are inter-digitally dispersed on the second surface of the single-crystal piezoelectric body.

30. The MEMS vibrating structure of claim 20 wherein the first conductive section of the conductive layer is adapted to receive a first alternating current (AC) voltage, and the second conductive section of the conductive layer is adapted to receive a second AC voltage that is 180 degrees out of phase with the first AC voltage.

31. The MEMS vibrating structure of claim 20 wherein the MEMS vibrating structure is adapted for use as a radio frequency filter.

32. The MEMS vibrating structure of claim 20 wherein the single-crystal piezoelectric body comprises lithium tantalate.

* * * * *